US012393126B2

(12) United States Patent
Uitterdijk

(10) Patent No.: US 12,393,126 B2
(45) Date of Patent: Aug. 19, 2025

(54) SUB MICRON PARTICLE DETECTION ON BURL TOPS BY APPLYING A VARIABLE VOLTAGE TO AN OXIDIZED WAFER

(71) Applicant: ASML Holding N.V., Veldhoven (NL)

(72) Inventor: Tammo Uitterdijk, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 203 days.

(21) Appl. No.: 18/012,317

(22) PCT Filed: Jun. 4, 2021

(86) PCT No.: PCT/EP2021/065079
§ 371 (c)(1),
(2) Date: Dec. 22, 2022

(87) PCT Pub. No.: WO2021/259619
PCT Pub. Date: Dec. 30, 2021

(65) Prior Publication Data
US 2023/0314962 A1 Oct. 5, 2023

Related U.S. Application Data

(60) Provisional application No. 63/042,760, filed on Jun. 23, 2020.

(51) Int. Cl.
G03F 7/00 (2006.01)
H01L 21/67 (2006.01)
H01L 21/683 (2006.01)

(52) U.S. Cl.
CPC ...... G03F 7/70783 (2013.01); G03F 7/70708 (2013.01); H01L 21/67288 (2013.01); H01L 21/6831 (2013.01)

(58) Field of Classification Search
CPC ............. G03F 7/70783; G03F 7/70708; H01L 21/67288; H01L 21/6831
See application file for complete search history.

(56) References Cited

U.S. PATENT DOCUMENTS 5,459,632 A    10/1995   Birang et al.
6,333,572 B1   12/2001   Ono
(Continued)

FOREIGN PATENT DOCUMENTS

JP    2010-177686 A      8/2010
WO    WO 2012/123144 A1  9/2012
WO    WO 2019/042682 A1  3/2019

OTHER PUBLICATIONS

International Search Report and Written Opinion of the International Searching Authority directed to International Patent Application No. PCT/EP2021/065079, mailed Sep. 23, 2021; 12 pages.
(Continued)

Primary Examiner — Jared Fureman
Assistant Examiner — Samantha L Faubert
(74) Attorney, Agent, or Firm — Sterne, Kessler, Goldstein & Fox P.L.L.C.

(57) ABSTRACT

Systems, apparatuses, methods, and computer program products are provided for determining a free form flatness of a substrate table. An example system can include a substrate table that includes a first substrate table surface and a grounded substrate table electrical connection configured to ground the substrate table. The system can further include a substrate that includes a semiconducting layer, a thermally-grown insulating layer, a first substrate surface disposed on the insulating layer, and a substrate electrical connection configured to transmit a voltage to the semiconducting layer. The system can further include a metrology system configured to apply a voltage to the substrate electrical connection to electrostatically clamp the substrate to the substrate table, measure a flatness of the first substrate surface, and determine a free form flatness of the first substrate table surface based on the measured flatness of the first substrate surface.

18 Claims, 13 Drawing Sheets

(56) References Cited

U.S. PATENT DOCUMENTS

| | | |
|---|---|---|
| 6,952,253 B2 | 10/2005 | Lof et al. |
| 7,511,799 B2 | 3/2009 | Tel et al. |
| 9,330,952 B2* | 5/2016 | Moslehi .............. H01L 21/683 |
| 2009/0284894 A1 | 11/2009 | Cooke |
| 2011/0303844 A1 | 12/2011 | Kanno et al. |
| 2014/0002805 A1* | 1/2014 | Banine ................ H01L 21/683 |
| 2016/0035609 A1 | 2/2016 | Chiou et al. |
| 2020/0150549 A1 | 5/2020 | Stevens et al. |
| 2021/0313444 A1* | 10/2021 | Hurley .................. H01L 29/66 |

OTHER PUBLICATIONS

International Preliminary Report on Patentability directed to International Patent Application No. PCT/EP2021/065079, issued Dec. 13, 2022; 9 pages.

Dimilia et al., "Combined Contactless Electrostatic and Vacuum Wafer Chuck," IP.com, Technical Disclosure No. IPCOM000063594D, Mar. 1, 1985; 3 pages.

\* cited by examiner

SUB MICRON PARTICLE DETECTION ON BURL TOPS BY APPLYING A VARIABLE VOLTAGE TO AN OXIDIZED WAFER

CROSS-REFERENCE TO RELATED APPLICATIONS

This application claims priority of U.S. Provisional Patent Application No. 63/042,760, which was filed on Jun. 23, 2020, and which is incorporated herein in its entirety by reference.

TECHNICAL FIELD

The present disclosure relates to substrate tables and methods for determining the free form flatness of a substrate table.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon (Si) wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

SUMMARY

The present disclosure describes various aspects of systems, apparatuses, and methods for determining a free form flatness of a substrate table based on a measured flatness of a thermally-oxidized substrate that is electrostatically clamped to the substrate table.

In some aspects, the present disclosure describes a substrate. The substrate can include a first substrate layer including a semiconducting material. The substrate can further include a second substrate layer including an insulating material. The substrate can further include a substrate surface disposed on the second substrate layer. The substrate can further include an electrical connection configured to receive a voltage and transmit the voltage to the first substrate layer to electrostatically clamp the substrate to a substrate table while a flatness of the substrate surface is measured. In some aspects, the substrate can include an electrostatic wafer including the first substrate layer, the second substrate layer, the substrate surface, and the electrical connection.

In some aspects, a free form flatness of the substrate table can be measured based on the measured flatness of the substrate surface. In some aspects, the flatness of the substrate surface can be measured in a near atmospheric environment. In some aspects, the second substrate layer can have a thickness of greater than or equal to about 500 nm, and the voltage can be greater than or equal to about 50 volts. In some aspects, the second substrate layer can have a thickness of greater than or equal to about 5.0 micrometers (microns), and the voltage can be greater than or equal to about 500 volts. In some aspects, a breakdown strength of a 1.0 micron thick thermally-grown SiO2 layer can be about 500 volts/micron, and the electrical field strength can be about 125 volts/micron (e.g., a safety factor of four). Accordingly, in some aspects, the voltage can be as low as 50 volts for substrates with an oxidation layer as thin as a few hundred nanometers or as high as 500 volts for substrates with an oxidation layer as thick as a few microns.

In some aspects, the insulating material can be a thermally-grown insulating material. In some aspects, the thermally-grown insulating material can be a thermally-grown oxide material. In some aspects, the thermally-grown oxide material can be a thermally-grown silicon dioxide material. In some aspects, the second substrate layer can be formed to a thickness of between about 0.5 microns and about 5.0 microns.

In some aspects, where the substrate surface is a first substrate surface, the substrate can further include a third substrate layer including the thermally-grown insulating material and a second substrate surface disposed on the third substrate layer opposite the first substrate surface. In some aspects, the electrical connection can be further configured to transmit the voltage to the first substrate layer to electrostatically clamp the second substrate surface to the substrate table.

In some aspects, where the electrical connection is a first electrical connection, the substrate can further include a second electrical connection. In some aspects, the substrate is configured to generate or provide (e.g., for measurement by a metrology system) a resistance value between the first electrical connection and the second electrical connection to ensure that each of the first electrical connection and the second electrical connection has an acceptable resistance value.

In some aspects, the present disclosure describes a system. The system can include a substrate. The substrate can include a first substrate layer including a semiconducting material. The substrate can further include a second substrate layer including a thermally-grown insulating material and formed on a first face of the first substrate layer. The substrate can further include a third substrate layer including the thermally-grown insulating material and formed on a second face of the first substrate layer opposite the first face of the first substrate layer. The substrate can further include a first substrate surface disposed on the second substrate layer. The substrate can further include a second substrate surface disposed on the third substrate layer opposite the first substrate surface. The substrate can further include an electrical connection configured to receive a voltage and transmit the voltage to the first substrate layer to electrostatically clamp the second substrate surface to a substrate table while a flatness of the first substrate surface is measured.

In some aspects, where the electrical connection is a first electrical connection, the substrate can further include a second electrical connection. In some aspects, the system can further include a metrology system configured to measure a resistance value between the first electrical connection and the second electrical connection to ensure that each of the first electrical connection and the second electrical connection has an acceptable resistance value. In some aspects, the metrology system can be configured to determine whether the resistance value is greater than a resistance value threshold. In some aspects, in response to a determination that the resistance value is greater than the resistance value threshold, the metrology system can be configured to generate an electrical connection status signal configured to instruct the system to generate a display screen overlay, graphic, icon, text, electronic message (e.g., an e-mail or short message service (SMS) message), sound, light (e.g., by actuating a green LED), or any other suitable indication that both the first electrical connection and the second electrical connection have an acceptable resistance value or are otherwise adequately connected to the first substrate layer (e.g., the semiconducting layer of the substrate). In some aspects, in response to a determination that the resistance value is less than the resistance value threshold, the metrology system can be configured to generate an electrical connection alarm signal configured to instruct the system to generate a display screen overlay, graphic, icon, text, electronic message, sound, light (e.g., by actuating a red light-emitting diode (LED)), or any other suitable indication that one or both of the first electrical connection and the second electrical connection does not have an acceptable resistance value or is otherwise not adequately connected to the first substrate layer.

In some aspects, the present disclosure describes a method for manufacturing a substrate. The method can include forming a first thermally-grown insulating layer on a first face of a semiconducting layer. The first thermally-grown insulating layer can include a first substrate surface. The method can further include forming a second thermally-grown insulating layer on a second face of the semiconducting layer disposed opposite the first face of the semiconducting layer. The second thermally-grown insulating layer can include a second substrate surface disposed opposite the first substrate surface. The method can further include forming an electrical connection. The electrical connection can be configured to receive a voltage and transmit the voltage to the semiconducting layer to electrostatically clamp the second substrate surface to a substrate table while a flatness of the first substrate surface is measured.

In some aspects, the present disclosure describes a substrate table. The substrate table can include a substrate table surface configured to support a substrate including a semiconducting layer and an insulating layer. The substrate table can further include an electrical connection configured to ground the substrate table. In response to an application of a voltage to the semiconducting layer of the substrate, the substrate table can be configured to electrostatically clamp the substrate to the substrate table surface while a flatness of the substrate is measured.

In some aspects, the substrate table can include siliconized silicon carbide (SiSiC). In some aspects, the substrate table can include a wafer table for deep ultraviolet (DUV) lithography. In some aspects, the wafer table can include an immersion wafer table. In some aspects, the substrate table can include a wafer clamp for extreme ultraviolet (EUV) lithography. In some aspects, the wafer clamp can include an electrostatic wafer clamp.

In some aspects, the substrate table can further include a plurality of burls disposed on the substrate table surface. In some aspects, each of the plurality of burls can include a burl-top surface configured to contact a portion of the substrate in response to the application of the voltage to the semiconducting layer of the substrate. In some aspects, the plurality of burls can include at least one material selected from the group consisting of diamond-like carbon (DLC), aluminum nitride (AlN), silicon nitride (SiN), or chromium nitride (CrN). In some aspects, for each of the first plurality of burls, a local electrostatic clamping pressure between the burl-top surface and the portion of the substrate can be less than or equal to about ten bar. For example, with a breakdown strength of a thermally-grown $SiO_2$ layer of about 500 volts/micron for a 1.0 micron thick $SiO_2$ layer, the local electrostatic clamping pressure can be less than or equal to about 10 bar for an electrical field strength of 125 volts/micron (e.g., a safety factor of four).

In some aspects, where the substrate table surface is a first substrate table surface, the substrate table can further include a second substrate table surface disposed opposite the first substrate table surface. In some aspects, in response to an application of a vacuum to a vacuum connection of a reference block, the substrate table can be further configured to vacuum clamp the second substrate table surface to the reference block while the flatness of the substrate is measured.

In some aspects, in response to the application of the vacuum to the vacuum connection of the reference block, the substrate table can be further configured to vacuum clamp the second substrate table surface to a three-point support structure of the reference block while a gravity sag of the substrate table is measured. In some aspects, a free form flatness of the substrate table surface is measured based on the measured flatness of the substrate and the measured gravity sag of the substrate table.

In some aspects, where the plurality of burls is a first plurality of burls, the substrate table can further include a second plurality of burls disposed on the second substrate table surface. In some aspects, each of the second plurality of burls can include a burl-bottom surface configured to contact a portion of the reference block in response to the application of the vacuum to the vacuum connection of the reference block.

In some aspects, where the application of the voltage is a first application of a first voltage and the measured flatness of the substrate is a measured first flatness of the substrate, the substrate table can be further configured to electrostatically clamp, in response to a second application of a second voltage to the semiconducting layer of the substrate, the substrate to the substrate table surface while a second flatness of the substrate is measured. In some aspects, the substrate can include a thermally-grown insulating layer having a thickness of greater than or equal to about 500 nm, and a difference between the first voltage and the second voltage can be less than or equal to about 10 volts. In other aspects, the substrate can include a thermally-grown insulating layer having a thickness of between about 500 nm and 1.0 micron, the first voltage can be about 10 volts, the second voltage can be about 40 volts, and the difference between the first voltage and the second voltage can be about 30 volts.

In some aspects, burl contamination can be measured based on the measured first flatness of the substrate and the measured second flatness of the substrate. In some aspects, the measured burl contamination can include burl-top contamination data associated with a first set of particles disposed between the first plurality of burls and the substrate. In some aspects, the measured burl contamination can include burl-bottom contamination data associated with a second set of particles disposed between the second plurality of burls and the reference block. In some aspects, the first set of particles can include a detected first particle having a first diameter of less than about one micron. In some aspects, the second set of particles can include a detected second particle having a second diameter of less than about one micron.

In some aspects, the present disclosure describes a system. The system can include a substrate table. The substrate table can include a first substrate table surface. The substrate table can further include a second substrate table surface disposed opposite the first substrate table surface. The substrate table can further include a first plurality of burls disposed on the first substrate table surface and configured to support a substrate including a semiconducting layer, a first thermally-grown insulating layer disposed on a first face of the semiconducting layer, and a second thermally-grown insulating layer disposed on a second face of the semiconducting layer opposite the first face of the semiconducting layer. The substrate table can further include a second plurality of burls disposed on the second substrate table surface and configured to be supported by a reference block including a vacuum connection. The substrate table can further include an electrical connection configured to ground the substrate table. In response to an application of a voltage to the semiconducting layer of the substrate, the substrate table can be configured to electrostatically clamp the substrate to the first plurality of burls while a flatness of the substrate is measured. In response to an application of a vacuum to the vacuum connection of the reference block, the substrate table can be configured to vacuum clamp the reference block to the second plurality of burls while the flatness of the substrate is measured.

In some aspects, the present disclosure describes a method for manufacturing a substrate table. The method can include forming a first plurality of burls on a first surface of the substrate table. The method can further include forming a second plurality of burls on a second surface of the substrate table disposed opposite the first surface of the substrate table. The first plurality of burls can be configured to support a substrate including a semiconducting layer, a first thermally-grown insulating layer disposed on a first face of the semiconducting layer, and a second thermally-grown insulating layer disposed on a second face of the semiconducting layer opposite the first face of the semiconducting layer. The second plurality of burls can be configured to be supported by a reference block including a vacuum connection. Each of the first plurality of burls can include a burl-top surface configured to contact a portion of the substrate in response to an application of a voltage to the semiconducting layer of the substrate while a flatness of the substrate is measured. Each of the second plurality of burls can include a burl-bottom surface configured to contact a portion of the reference block in response to an application of a vacuum to the vacuum connection of the reference block while the flatness of the substrate is measured.

In some aspects, the present disclosure describes a metrology system. The metrology system can include a processor configured to apply (e.g., via a voltage controller and a voltage source) a voltage to a substrate to electrostatically clamp the substrate to a substrate table. The metrology system can further include a radiation source configured to generate radiation in response to application of the voltage to the substrate. The radiation source can be further configured to transmit the generated radiation towards the electrostatically-clamped substrate. The metrology system can further include a radiation detector configured to receive reflected radiation from the electrostatically-clamped substrate in response to irradiation of the substrate by the transmitted radiation. The radiation detector can be further configured to measure a flatness of the substrate based on the received reflected radiation.

In some aspects, the generated radiation can include a plurality of radiation beams, and the reflected radiation can include a plurality of reflected radiation beams In some aspects, the processor can be further configured to determine a free form flatness of the substrate table based on the measured flatness of the substrate. In some aspects, the radiation detector can be configured to measure the received reflected radiation in a near atmospheric environment. In some aspects, the substrate can include a thermally-grown insulating layer having a thickness of greater than or equal to about 500 nm, and the voltage can be greater than or equal to about 50 volts. In some aspects, a local electrostatic clamping pressure between the substrate and the substrate table can be less than or equal to about ten bar.

In some aspects, the processor can be further configured to apply a vacuum to a reference block to vacuum clamp the substrate table to the reference block. In some aspects, the reference block can include a three-point support structure. In some aspects, the processor can be further configured to apply the vacuum to the reference block to vacuum clamp the substrate table to the three-point support structure of the reference block. In some aspects, the processor can be further configured to determine a gravity sag of the substrate table based on the received reflected radiation. In some aspects, the processor can be further configured to determine a modified flatness of the substrate based on the measured flatness of the substrate and the determined gravity sag of the substrate table. In some aspects, the processor can be further configured to determine a free form flatness of the substrate table based on the modified flatness of the substrate.

In some aspects, where the voltage is a first voltage, the radiation is first radiation, the reflected radiation is first reflected radiation, and the flatness is a first flatness, the processor can be further configured to apply, at a first time, the first voltage to the substrate and apply, at a second time different from the first time, a second voltage to the substrate. In some aspects, the radiation source can be further configured to generate second radiation in response to application of the second voltage to the substrate. In some aspects, the radiation source can be further configured to transmit the generated second radiation towards the electrostatically-clamped substrate. In some aspects, in response to irradiation of the substrate by the transmitted second radiation, the radiation detector can be further configured to receive second reflected radiation from the electrostatically-clamped substrate. In some aspects, the radiation detector can be further configured to measure a second flatness of the substrate based on the received second reflected radiation. In some aspects, the second voltage can be different from the first voltage. In some aspects, the substrate can include a thermally-grown insulating layer having a thickness of greater than or equal to about 500 nm, and a difference between the first voltage and the second voltage can be less than or equal to about 50 volts.

In some aspects, the processor can be further configured to generate contamination data based on the measured first flatness and the measured second flatness. In some aspects, the generated contamination data can include first contamination data associated with a first set of particles disposed on a first surface of the substrate table. In some aspects, the generated contamination data can further include second contamination data associated with a second set of particles disposed on a second surface of the substrate table opposite the first surface of the substrate table. In some aspects, the processor can be further configured to detect, based on the first contamination data, a first particle disposed on the first surface of the substrate table. In some aspects, the detected first particle can have a first diameter of less than about one micron. In some aspects, the processor can be further configured to detect, based on the second contamination data, a second particle disposed on the second surface of the substrate table. In some aspects, the detected second particle can have a second diameter of less than about one micron.

In some aspects, the present disclosure describes a method for determining a flatness of a substrate. The method can include applying, by a voltage source, a voltage to a substrate to electrostatically clamp the substrate to a substrate table. The method can further include irradiating, by the radiation source, the electrostatically-clamped substrate with radiation in response to the applying of the voltage. The method can further include receiving, by a radiation detector, reflected radiation from the electrostatically-clamped substrate in response to the irradiating of the substrate. The method can further include measuring, by the radiation detector, a flatness of the substrate based on the reflected radiation.

In some aspects, the present disclosure describes a method for determining a free form flatness of a substrate table. The method can include applying, by a processor, a voltage to a substrate to electrostatically clamp the substrate to a substrate table. The method can further include measuring, by the processor, a flatness of the substrate. The method can further include determining, by the processor, a free form flatness of the substrate table based on the measured flatness of the substrate.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
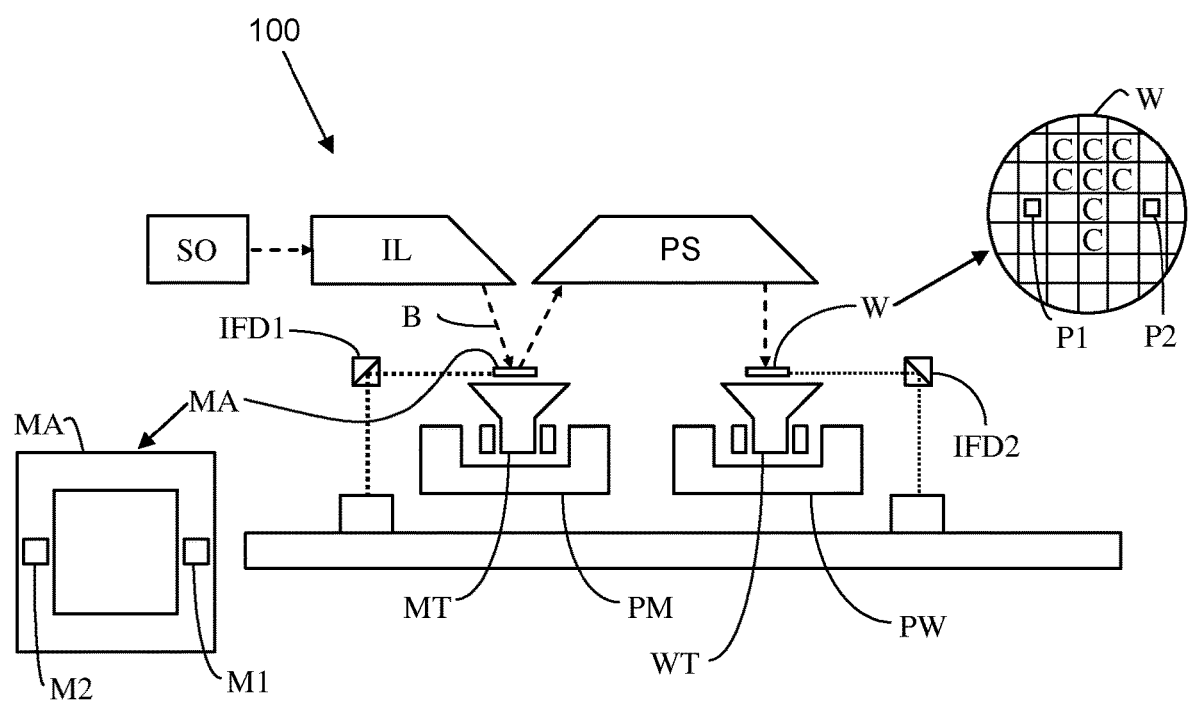
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, a wafer table or a wafer clamp can have a plurality of top burls configured to support a wafer, a plurality of bottom burls configured to be supported by a reference block, or both. These burls can be DLC burls formed in part by a DLC coating process. During the manufacturing and DLC coating process of such devices, such as during flatness qualification and scanner integration processes, it can be important to know which burls are suffering from particle contamination. It can also be important to know if these particles are on the top burls or the bottom burls so that, in some aspects, they can be cleaned off efficiently. However, during the manufacturing and DLC coating process of dry and immersion wafer tables, it may not be possible to detect sub-micron particles on the burls, which can cause a significant impact on the yield and move rates.

In another example, after installing a wafer clamp in the interferometer as part of a flatness qualification process, burl contamination can be determined by applying vacuum to the backfill gas (BFG) channels. However, it may not be possible to apply high voltage to the top and bottom electrodes of the wafer clamp under atmospheric conditions. Rather, high voltage may only be applied after the vacuum chamber is pumped down, leading to several extra pump and vent sequences.

In still another example, after a wafer stage shift out at an installation site, the wafer tables and wafer clamps can be manually cleaned. However, there may not be an effective and sensitive method to determine if the burls are clean enough to meet the system overlay specifications. Additionally, it may not be possible to measure the free form flatness of wafer tables and wafer clamps with an accuracy of 100 nm or less (e.g., peak-to-valley (PV)).

In contrast, some aspects of the present disclosure can provide effective techniques for qualifying wafer table or wafer clamp cleanliness in both manufacturing and installation sites. For example, some aspects of the present disclosure can provide for using low voltage electrostatic clamping of an electrostatic wafer to a wafer table or wafer clamp for detecting particles located on burl tops and measuring the free form flatness of the wafer table or wafer clamp.

In some aspects, the present disclosure can provide for making sub-micron particles on burl tops visible by using a thermally-oxidized wafer that is electrostatically clamped onto grounded burls. In some aspects, a thermally-grown oxide layer (e.g., silicon dioxide ($SiO2$)) having a thickness of about 0.5 microns to about 5.0 microns thickness can act as a dielectric layer between the wafer and the burl top. In one example, by applying as little as 40 volts over a 1.0 micron thick oxide layer, a local burl top clamping pressure of about 1.0 bar is generated. In some aspects, the clamp pressure in between the burls can be substantially negligible due to air gaps of about 10 microns to about 150 microns. In some aspects, a local 1.0 micron thick particle or contamination layer on top of a burl can lead to a global deformation of the wafer, which can be visible with an interferometer or an optical flat. In some aspects, while the wafer table or wafer clamp is clamped down on a reference block using vacuum or high voltage on the bottom side, the voltage on the wafer (e.g., on the top side of the wafer table or wafer clamp) can be varied from about 0 volts to about 40 volts to separate (e.g., distinguish) bottom burl contamination from top burl contamination.

Some aspects of the present disclosure can further provide for wafer table or wafer clamp free form flatness qualification. For example, some aspects of the present disclosure can provide for clamping the oxidized wafer onto an immersion wafer table or a wafer clamp to determine the free form flatness inside an interferometer setup. Since the wafer stiffness is orders of magnitude lower than the stiffness of the wafer table or wafer clamp, the measured wafer flatness can match the free form flatness of the wafer table or wafer clamp. In some aspects, the thickness variation of this oxidized wafer can be qualified separately and subtracted from the measured wafer flatness (e.g., as is gravity-induced flatness or "gravity sag").

In some aspects, the present disclosure provides for determining a free form flatness of a substrate table based on a measured flatness of a thermally-oxidized substrate that is electrostatically clamped to the substrate table. Some aspects of the present disclosure can further provide for sub-micron particle detection on burl tops by applying a variable voltage, a variable vacuum, or both to an oxidized wafer (e.g., as discussed with reference to FIGS. 6A, 6B, and 6C).

In one illustrative example, some aspects of the present disclosure can provide for a substrate table that includes a first substrate table surface and a substrate table electrical connection configured to ground the substrate table. Some aspects of the present disclosure can provide for a substrate that includes a semiconducting layer, a thermally-grown insulating layer, a first substrate surface disposed on the insulating layer, and a substrate electrical connection configured to transmit a voltage to the semiconducting layer. Some aspects of the present disclosure can provide for a metrology system configured to apply a voltage to the substrate electrical connection to electrostatically clamp the substrate to the substrate table, measure a flatness of the first substrate surface, and determine a free form flatness of the first substrate table surface based on the measured flatness of the first substrate surface. Some aspects of the present disclosure can provide for a reference block that includes a first reference block surface and a first vacuum connection; the substrate table can further include a second substrate table surface disposed opposite the first substrate table surface; and the metrology system can be further configured to apply a vacuum to the first vacuum connection to vacuum clamp the second substrate table surface to the first reference block surface.

In some aspects, for detecting particles on burls at the installation site, some example techniques can use a vacuum clamped wafer using the BFG channels and a relatively small optical flat (e.g., having a diameter of around 75 mm) to detect Newton fringes. In some aspects, the present disclosure provides for electrostatically clamping a wafer as described above and replacing the small optical flat with a larger optical flat (e.g., having a diameter of around 300 mm) to increase the sensitivity to small particles and to speed up the process.

There are many exemplary aspects to the systems, apparatuses, methods, and computer program products disclosed herein. For example, aspects of the present disclosure provide for detecting sub-micron particles on burl tops during the manufacturing of wafer tables and wafer clamps, which can substantially increase the yield and move rates. In another example, aspects of the present disclosure provide for determining burl top contamination under atmospheric conditions after installing a wafer clamp in the interferometer as part of a flatness qualification process, thereby reducing, and in some aspects substantially eliminating, vacuum pump and vent sequences. In another example, aspects of the present disclosure provide for effective and sensitive methods to determine if, after manual cleaning following a wafer stage shift out at an installation site, the burl tops are clean enough to meet system overlay specifications. In another example, aspects of the present disclosure provide for measuring the free form flatness of wafer tables and wafer clamps with an accuracy of 100 nm or less (e.g., PV). In yet another example, aspects of the present disclosure provide for a thermally-oxidized electrostatic substrate that is substantially pinhole free with substantially no contaminant particles disposed between the thermally-grown oxide and the semiconducting layer of the substrate (e.g., because thermal oxidation takes place under any contaminant particles disposed on the surface of the semiconducting layer, in contrast to deposited oxide layers that can have multiple pinholes and micron-sized contaminant particles disposed between the semiconducting layer and the deposited oxide). As a result of the techniques described in the present disclosure, during the manufacturing of wafer tables and wafer clamps, such as during flatness qualification and scanner integration processes, aspects of the present disclosure can determine which burls are suffering from particle contamination and whether these particles are on the top or the bottom burls so that, in some aspects, they can be cleaned off efficiently to decrease contamination and increase yield.

Before describing such aspects in more detail, however, it is instructive to present an example environment in which aspects of the present disclosure can be implemented.

Example Lithographic Systems

Figure 1B:
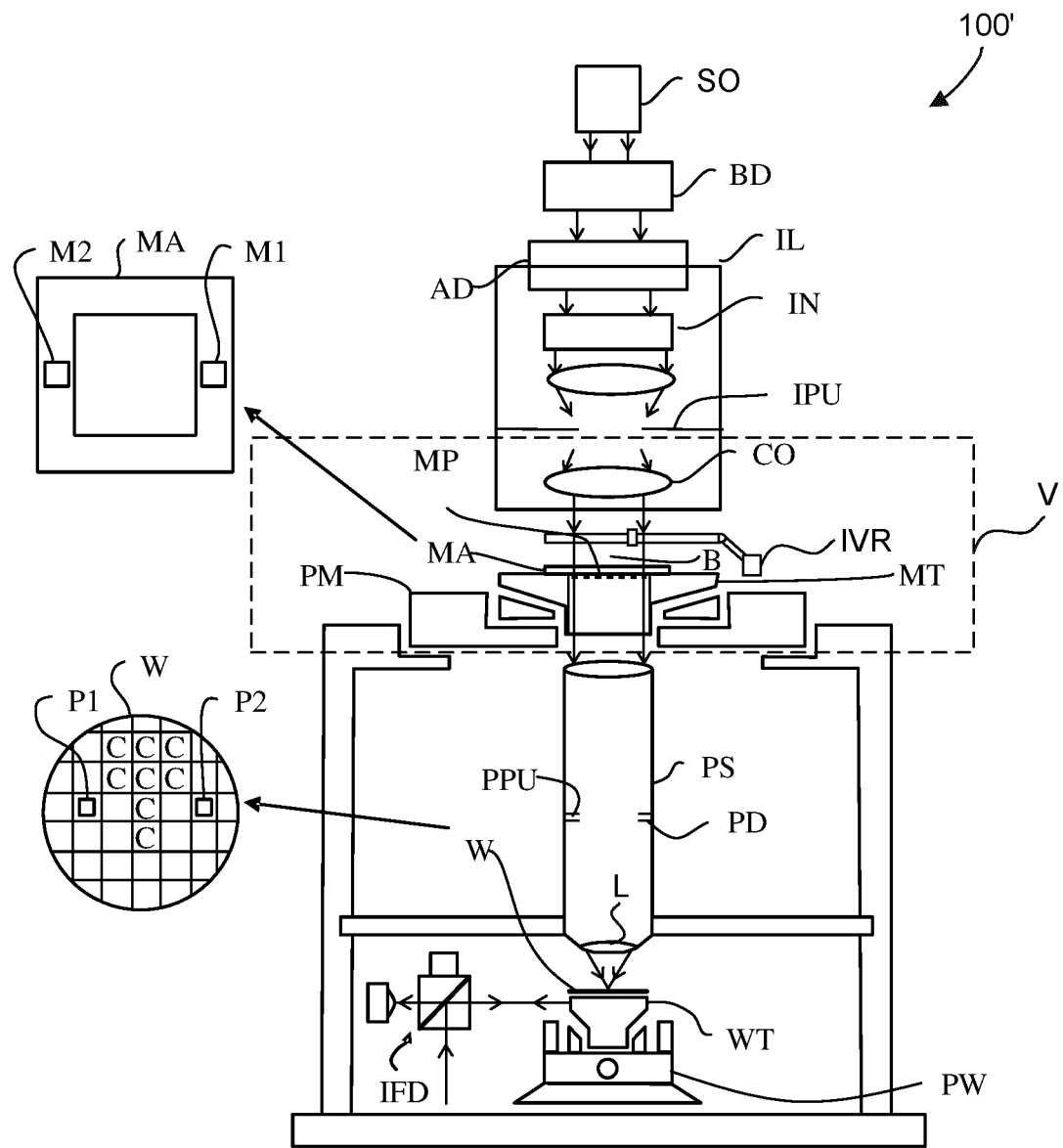
FIG. 1B is a schematic illustration of an example transmissive lithographic apparatus according to some aspects of the present disclosure.

FIGS. 1A and 1B are schematic illustrations of a lithographic apparatus 100 and lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table or wafer clamp) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks). Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.
2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.
3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
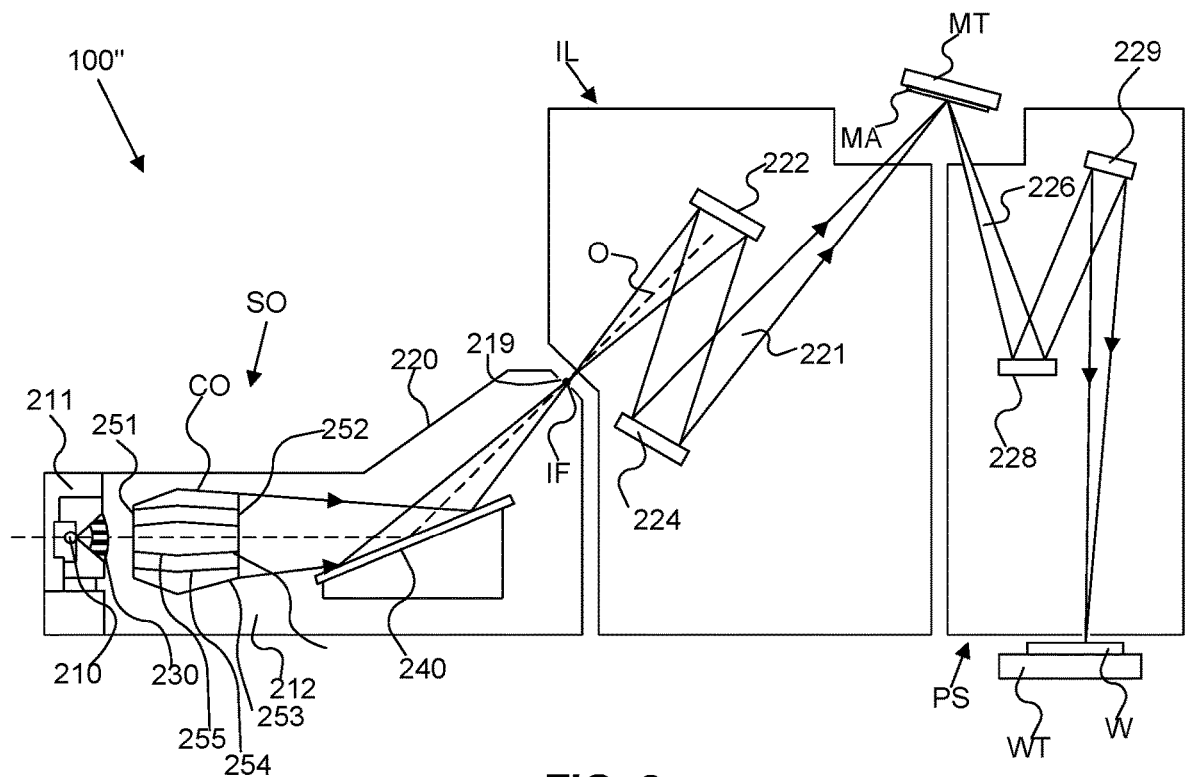
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. Grating spectral filter 240 is used in particular for suppressing infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
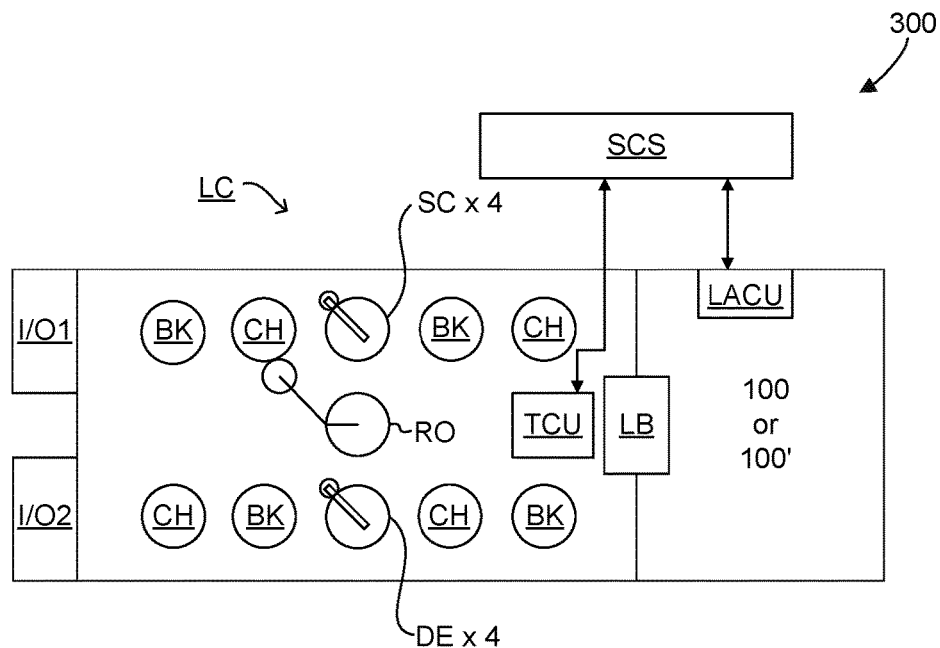
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and 1/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Substrate Stage

Figure 4:
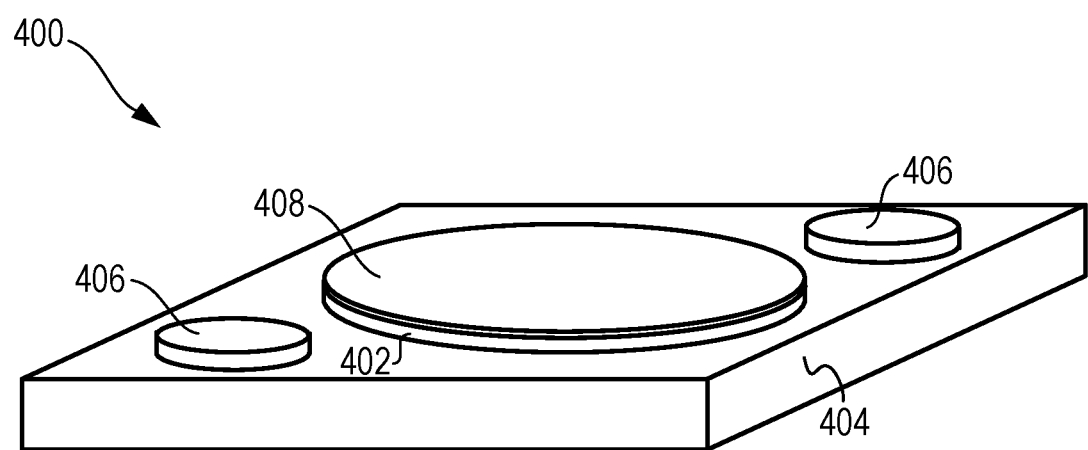
FIG. 4 is a schematic illustration of an example substrate stage according to some aspects of the present disclosure.

FIG. 4 shows a schematic illustration of an example substrate stage 400, according to some aspects of the present disclosure. In some aspects, the example substrate stage 400 can include a substrate table 402, a support block 404 (e.g., a reference block), one or more sensor structures 406, any other suitable component, or any combination thereof. In some aspects, substrate table 402 comprises a clamp (e.g., a wafer clamp, a reticle clamp, an electrostatic clamp) to hold a substrate 408. In some aspects, each of one or more sensor structures 406 comprises a transmission image sensor (TIS) plate. The TIS plate is a sensor unit that comprises one or more sensors and/or markers for use in a TIS sensing system used for accurate positioning of the wafer relative to the position of a projection system (e.g., projection system PS described with reference to FIGS. 1A, 1B, and 2) and a mask (e.g., patterning device MA described with reference to FIGS. 1A, 1B, and 2) of a lithographic apparatus (e.g., lithographic apparatus 100 and lithographic apparatus 100' described with reference to FIGS. 1A, 1B, and 2). While TIS plates are shown here for illustration, aspects herein are not limited to any particular sensor. Substrate table 402 is disposed on support block 404. One or more sensor structures 406 are disposed on support block 404.

In some aspects, substrate 408 can be disposed on substrate table 402 when the example substrate stage 400 supports the substrate 408.

The terms "flat," "flatness" or the like can be used herein to describe structures in relation to a general plane of a surface. For example, a bent or unleveled surface can be one that does not conform to a flat plane. Protrusions and recesses on a surface can also be characterized as deviations from a "flat" plane.

The terms "smooth," "roughness" or the like, can be used herein to refer to a local variation, microscopic deviations, graininess, or texture of a surface. For example, the term "surface roughness" can refer to microscopic deviations of the surface profile from a mean line or plane. The deviations are generally measured (in unit of length) as an amplitude parameter, such as root mean squared (RMS) or arithmetical mean deviation (Ra) (e.g., 1.0 nm RMS).

In some aspects, the surface of the substrate tables mentioned above (e.g., substrate table WT in FIGS. 1A and 1B, substrate table 402 in FIG. 4) can be flat or burled. When the surface of a substrate table is flat, any particulates or contaminants stuck between the substrate table and a wafer can cause the contaminant to print through the wafer, causing lithography errors in its vicinity. Consequently, contaminants can reduce device yield rates and can increase production costs.

In some aspects, disposing burls on substrate tables can help to reduce the undesirable effects of a flat substrate table. In some aspects, when a wafer is clamped to a burled substrate table, empty spaces are available in the regions where the wafer does not contact the substrate table. The empty spaces can function as pockets for contaminants so as to prevent printing errors. In some aspects, contaminants located on the burls are more likely to become crushed due to the increased load caused by the burls. Crushing contaminants can help mitigate print-through errors as well. In some aspects, the combined surface area of the burls can be approximately one percent to five percent of the surface area of the substrate table. Here, surface area of the burls refers to the surfaces that come into contact with the wafer (e.g., not including the side walls); and surface area of the substrate table refers to the span of surface of the substrate table where the burls reside (e.g., not including the lateral or back side of the substrate table). When the wafer is clamped onto the burled substrate table, the load is increased by 100 fold as compared to a flat substrate table, which is enough to crush most contaminants. Though the example here uses a substrate table, the example is not intended to be limiting. For example, aspects of the present disclosure can be implemented on reticle tables, for a variety of clamping structures (e.g., electrostatic clamps, clamping membranes), and in a variety of lithographic systems (e.g., EUV, DUV).

In some aspects, the burl-to-wafer interface governs the functional performance of the substrate table. When the surface of a substrate table is smooth, an adhesion force can develop between the smooth surface of the substrate table and the smooth surface of a wafer. The phenomenon where two smooth surfaces in contact cling together is known as wringing. Wringing can cause issues (e.g., overlay issues) in device fabrication due to high friction and in-plane stresses in the wafer (it is optimal to have the wafer glide easily during alignment).

Example Substrates, Substrate Tables, Reference Blocks, and Metrology Systems

Figure 5A:
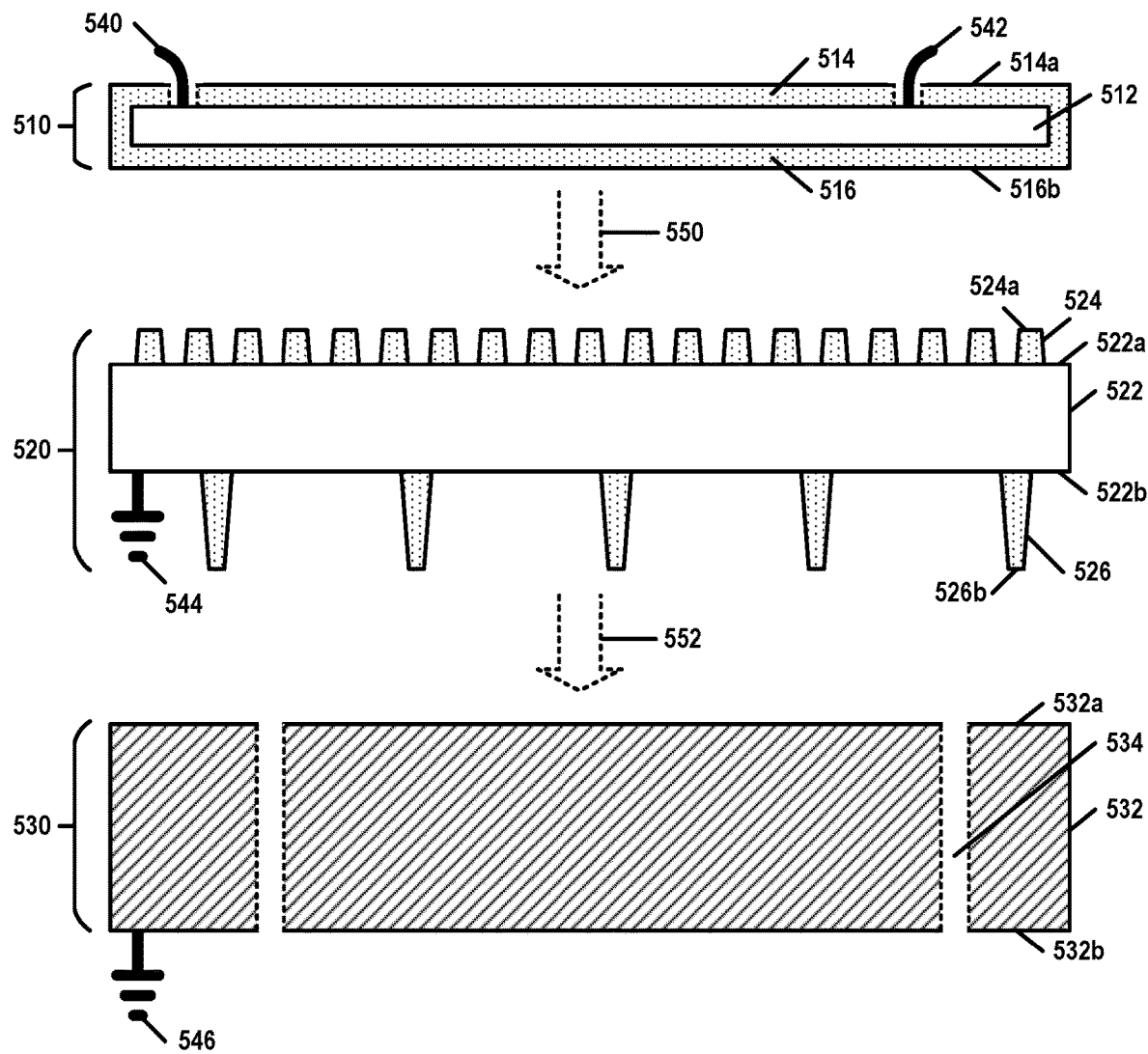
FIG. 5A is a schematic illustration of an exploded cross-sectional view of an example substrate, substrate table, and reference block according to some aspects of the present disclosure.

FIG. 5A is a schematic illustration of an exploded cross-sectional view 500 of a substrate 510, substrate table 520, and reference block 530 according to some aspects of the present disclosure.

In some aspects, the substrate 510 can include a first substrate layer 512 including a semiconducting material. The substrate 510 can further include a second substrate layer 514 including an insulating material. The substrate can further include a first substrate surface 514a disposed on the second substrate layer 514. In some aspects, the substrate 510 can further include a third substrate layer 516 including the insulating material and a second substrate surface 516b disposed on the third substrate layer 516 opposite the first substrate surface 514a. In some aspects, the substrate 510 can be, or include, an electrostatic wafer.

In some aspects, the semiconducting material can be silicon, such as a silicon wafer. In some aspects, the insulating material can be a thermally-grown insulating material, such as thermally-grown SiO2. In some aspects, the second substrate layer 514 can be formed (e.g., thermally grown) on a first face of the first substrate layer 512, and the third substrate layer 516 can be formed (e.g., thermally grown) on a second face of the first substrate layer 512 disposed opposite the first face of the first substrate layer 512. For example, the second substrate layer 514 and the third substrate layer 516 can be formed on the exposed surfaces of the first substrate layer 512 by thermally-oxidizing the first substrate layer 512. In some aspects, the second substrate layer 514, the third substrate layer 516, or both can be formed to a thickness of between about 0.5 microns and about 5.0 microns.

In some aspects, the substrate 510 can further include an electrical connection 540 formed by microfabrication techniques. For example, the electrical connection 540 can be formed by: (i) thermally oxidizing a silicon wafer; (ii) etching an opening or contact window using a SiO2 etchant; and (iii) attaching a wire in the opening using a conductive epoxy or another suitable technique.

Figure 5B:
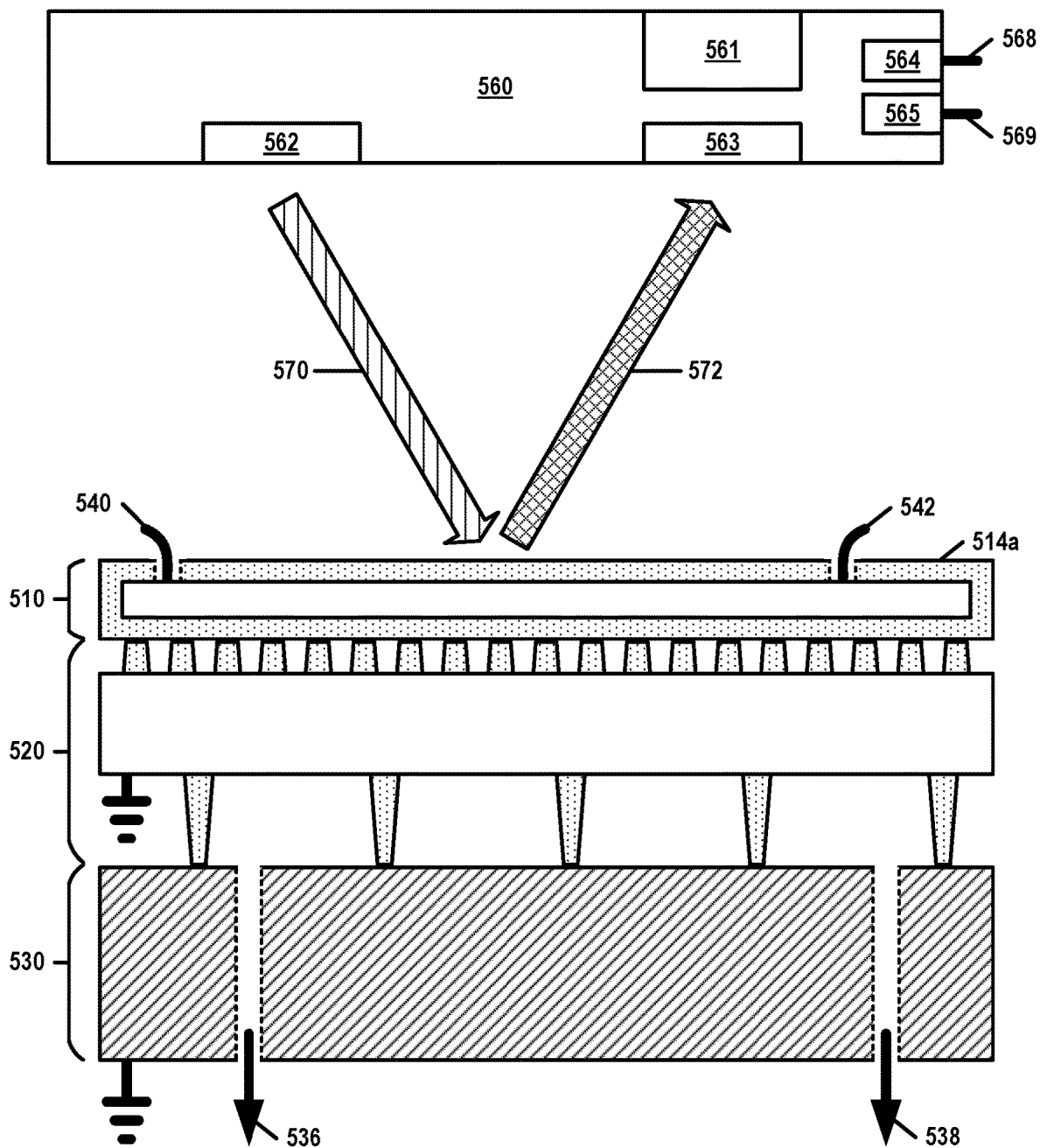
FIG. 5B is a schematic illustration of a cross-sectional view of an example metrology system, substrate, substrate table, and reference block according to some aspects of the present disclosure.

In some aspects, the electrical connection 540 can be configured to receive a voltage (e.g., 40 volts) and transmit the voltage to the first substrate layer 512 to electrostatically clamp (e.g., as indicated by arrow 550) the substrate 510 to a substrate table 520 while a flatness of the first substrate surface 514a is measured (e.g., by metrology system 560 shown in FIG. 5B). For example, the electrical connection 540 can be configured to transmit the voltage to the first substrate layer 512 to electrostatically clamp the second substrate surface 516b to the burl-top surface 524a of one or more of the plurality of top burls 524. In some aspects, a free form flatness (also referred to as a free form shape) of the substrate table 520 is measured (e.g., by metrology system 560) based on the measured flatness of the first substrate surface 514a.

In some aspects, the substrate 510 can further include one or more additional electrical connections (e.g., formed by microfabrication techniques), such as electrical connection 542, to ensure the accuracy of the applied voltage (e.g., by measuring the resistance across the electrical connections 540 and 542). In some aspects, an electrical resistance value between the electrical connection 540 and the electrical connection 542 can be processed to ensure that each of the first electrical connection and the second electrical connection has an acceptable resistance value and, in some aspects, is adequately connected to the first substrate layer 512 of the substrate 510.

In some aspects, the substrate table 520 can include a substrate table core 522. The substrate table core 522 can include a first substrate table surface 522a configured to support (e.g., via burl-top surface 524a of each of the plurality of top burls 524) the second substrate surface 516b of the substrate 510. The substrate table core 522 can further include a second substrate table surface 522b disposed opposite the first substrate table surface 522a and configured to be supported (e.g., via burl-bottom surface 526b of each of the plurality of bottom burls 526) by a first reference block surface 532a of a reference block 530. In some aspects, the substrate table core 522 can have a thickness of about 10 millimeters.

In some aspects, the substrate table 520 can be, or include, a wafer table for DUV lithography. In some aspects, the wafer table can include an immersion wafer table. In some aspects, the substrate table 520 can be, or include, a wafer clamp for EUV lithography. In some aspects, the wafer clamp can include an electrostatic wafer clamp.

In some aspects, the substrate table core 522 can include siliconized silicon carbide (SiSiC) (also referred to as reaction bonded silicon carbide) or any other suitable material (e.g., having a high stiffness and thermal conductivity). In some aspects, the substrate table 520 can further include an electrical connection 544 configured to ground the substrate table 520. In some aspects, the substrate table core 522 can further include a plurality of fluid channels configured to carry a thermally conditioned fluid. In some aspects, the substrate table core 522 can further include one or more insulating layers (e.g., a glass substrate, a borosilicate glass substrate, an alkaline earth boro-aluminosilicate) and one or more conducting layers disposed between the first substrate table surface 522a and the second substrate table surface 522b and forming one or more electrodes. In some aspects, the substrate table core 522 can further include any combination of structures, such as one or more composite layers, where each of the one or more composite layers includes one or more electrically conductive layers and one or more insulating layers that are arranged in an alternating configuration.

In some aspects, the substrate table 520 can further include a plurality of top burls 524 disposed on the first substrate table surface 522a. In some aspects, each of the plurality of top burls 524 can include a burl-top surface 524a configured to contact a portion of the second substrate surface 516b of the substrate 510 in response to the application of the voltage to the first substrate layer 512 of the substrate 510. In some aspects, for each of the plurality of top burls 524, a local electrostatic clamping pressure between the burl-top surface 524a and the portion of the second substrate surface 516b can be less than or equal to about ten bar. For example, the third substrate layer 516 can be a thermally-grown SiO2 layer having a thickness of about 1.0 micron and a breakdown strength of about 500 volts/micron, and the local electrostatic clamping pressure can be less than or equal to about 10 bar for an electrical field strength of 125 volts/micron (e.g., a safety factor of four).

In some aspects, the substrate table 520 can further include a plurality of bottom burls 526 disposed on the second substrate table surface 522b. In some aspects, each of the plurality of bottom burls 526 can include a burl-bottom surface 526b configured to contact a portion of the reference block 530 in response to an application of a vacuum to one or more of the plurality of vacuum connections 534 of the reference block 530.

In some aspects, the plurality of top burls 524, the plurality of bottom burls 526, or a combination thereof can include at least one material selected from the group consisting of DLC, AlN, Si, SiN, or CrN. In some aspects, the plurality of top burls 524, the plurality of bottom burls 526, or a combination thereof can further include a plurality of burl caps (e.g., CrN burl tops) formed by patterning and etching a burl top layer (e.g., a CrN layer) to form the plurality of burl caps. In some aspects, the plurality of top burls 524, the plurality of bottom burls 526, the plurality of burl caps, or a combination thereof can be electrically conductive (e.g., to electrically ground the substrate table 520).

In some aspects, the plurality of top burls 524 can be formed by patterning and etching a material layer (e.g., a DLC layer; a CrN, AlN, or SiN layer) to form the plurality of top burls 524. In some aspects, a hardness of a subset of the plurality of top burls 524 can be equal to or greater than about 6.0 GPa and, in some instances, greater than about 10.0 GPa, about 15.0 GPa, or even about 20.0 GPa. In some aspects, a thickness of the plurality of top burls 524 can be greater than about 2.0 microns and, in some instances, greater than about 5.0 microns, 7.5 microns, or even about 10.0 microns. In some aspects, a radius of each of the plurality of top burls 524 can be about 200.0 microns. In some aspects, the plurality of top burls 524 can include at least about 30,000 burls (e.g., a top burl pitch can be about 2.5 mm, 1.5 mm, or any other suitable pitch).

In some aspects, the plurality of bottom burls 526 can include any of the aspects described with reference to the plurality of top burls 524 or any other suitable burl or material. In some aspects, the plurality of top burls 524 can be referred to as "short" burls, and the plurality of bottom burls 526 can be referred to as "long" burls. In one illustrative example, a first subset of the plurality of top burls 524 can have a first thickness of about 10.0 microns, and a second subset of the plurality of bottom burls 526 can have a second thickness of about 1,000 microns. In other words, a thickness of the plurality of bottom burls 526 can be greater than a thickness of the plurality of top burls 524. In some aspects, the plurality of bottom burls 526 can include at least about 150 burls or any other suitable amount of burls.

In some aspects, in response to an application of a voltage to the first substrate layer 512 of the substrate 510 (e.g., via electrical connection 540), the substrate table 520 can be configured to electrostatically clamp (e.g., as indicated by arrow 550) the second substrate surface 516b to the first substrate table surface 522a (e.g., via the burl-top surface 524a of one or more of the plurality of top burls 524) while a flatness of the first substrate surface 514a is measured. In some aspects, in response to an application of a voltage to the first substrate layer 512 of the substrate 510, the substrate table 520 can be configured to electrostatically clamp the second substrate surface 516b to the burl-top surface 524a of one or more of the plurality of top burls 524 while a flatness of the first substrate surface 514a is measured. In some aspects, the electrical connection 542 can be used as a monitor to make sure that there is a low ohmic connection for the electrical connection 540 so that the voltage is applied sufficiently to the first substrate layer 512 of the substrate 510.

In some aspects, a free form flatness of the substrate table 520 can be measured based on the measured flatness of the first substrate surface 514a. In some aspects, the flatness of the first substrate surface 514a can be measured in a near atmospheric environment. In some aspects, the second substrate layer 514 can have a thickness of greater than or equal to about 500 nm, and the voltage applied via electrical connection 540 can be greater than or equal to about 50 volts. In some aspects, the second substrate layer 514, the third substrate layer 516, or both can have a thickness of greater than or equal to about 500 nm, and the voltage can be greater than or equal to about 50 volts. In some aspects, the second substrate layer 514, the third substrate layer 516, or both can have a thickness of greater than or equal to about 5.0 microns, and the voltage can be greater than or equal to about 500 volts.

In some aspects, reference block 530 can include a reference block core 532. The reference block core 532 can include a first reference block surface 532a configured to support the second substrate table surface 522b of the substrate table 520 (e.g., via burl-bottom surface 526b of each of the plurality of bottom burls 526). The reference block core 532 can further include a second reference block surface 532b disposed opposite the first reference block surface 532a. The reference block core 532 can further include a plurality of vacuum connections 534 formed between the first reference block surface 532a and the second reference block surface 532b. In some aspects, the reference block 530 can further include an electrical connection 546 configured to ground the reference block 530.

In some aspects, in response to an application of a vacuum to one or more of the plurality of vacuum connections 534 of the reference block 530, the reference block 530 can be further configured to vacuum clamp (e.g., as indicated by arrow 552) the second substrate table surface 522b (e.g., via the burl-bottom surface 526b of one or more of the plurality of bottom burls 526) to the first reference block surface 532a while the flatness of the first substrate surface 514a is measured.

In some aspects, in response to the application of the vacuum to one or more of the plurality of vacuum connections 534 of the reference block 530, the reference block 530 can be further configured to vacuum clamp the second substrate table surface 522b to a three-point support structure of the reference block 530 while a gravity sag of the substrate table 520 is measured (e.g., by metrology system 560). In some aspects, a free form flatness of the substrate table 520 is measured (e.g., by metrology system 560) based on the thickness variation of the substrate 510 (e.g., which may be measured separately by the metrology system 560), the measured gravity sag of the substrate table 520, and the measured flatness of the first substrate surface 514a. For example, a free form flatness of the substrate table 520 can be measured by subtracting the thickness variation of the substrate 510 and the measured gravity sag of the substrate table 520 from the measured flatness of the first substrate surface 514a.

FIG. 5B is a schematic illustration of a cross-sectional view 501 of a metrology system 560, substrate 510, substrate table 520, and reference block 530 according to some aspects of the present disclosure. In some aspects, the metrology system 560 can be, or include, an interferometry-based metrology system. In some aspects, the metrology system 560 can be further configured to measure burl contamination as described in greater detail with reference to FIGS. 6A, 6B, and 6C.

In some aspects, the metrology system 560 can include a processor 561 configured to apply (e.g., via a voltage controller 564, a voltage control signal 568, and a voltage source) a voltage (e.g., via electrical connection 540) to the substrate 510 to electrostatically clamp the substrate 510 to the substrate table 520. The metrology system 560 can further include a radiation source 562 configured to generate radiation 570 in response to application of the voltage to the substrate 510 (e.g., now an electrostatically-clamped substrate). The radiation source 562 can be further configured to transmit the radiation 570 towards the substrate 510. The metrology system 560 can further include a radiation detector 563 configured to receive reflected radiation 572 from the substrate 510 in response to irradiation of the substrate 510 by the radiation 570. The radiation detector 563 can be further configured to measure a flatness of the substrate 510 based on the reflected radiation 572.

In some aspects, the radiation 570 can include a plurality of radiation beams, and the reflected radiation 572 can include a plurality of reflected radiation beams. In some aspects, the processor 561 can be further configured to determine a free form flatness of the substrate table 520 based on the measured flatness of the substrate 510. In some aspects, the radiation detector 563 can be configured to measure the reflected radiation 572 in a near atmospheric environment. In some aspects, the substrate 510 can include a thermally-grown insulating layer (e.g., second substrate layer 514, third substrate layer 516) having a thickness of greater than or equal to about 500 nm, and the voltage can be greater than or equal to about 50 volts. In some aspects, a local electrostatic clamping pressure between the substrate 510 and the substrate table 520 can be less than or equal to about ten bar.

In some aspects, the processor 561 can be further configured to apply a vacuum 536, a vacuum 538, any other suitable vacuum, or a combination thereof to the reference block 530 (e.g., via one or more of the plurality of vacuum connections 534) to vacuum clamp the substrate table 520 to the reference block 530. In some aspects, the reference block 530 can include a three-point support structure (or, in some aspects, a four-point support structure or a ring mount). In some aspects, the processor 561 can be further configured to apply the vacuum 536, the vacuum 538, any other suitable vacuum, or a combination thereof to the reference block 530 to vacuum clamp the substrate table 520 to the three-point support structure of the reference block 530. In some aspects, the processor 561 can be further configured to determine a gravity sag (also called a gravitational sag, deflection, or warping) of the substrate table 520 based on the reflected radiation 572. In some aspects, the processor 561 can be further configured to determine a modified flatness of the substrate 510 based on the measured flatness of the substrate 510 and the determined gravity sag of the substrate table 520. In some aspects, the processor 561 can be further configured to determine a free form flatness of the substrate table 520 based on the modified flatness of the substrate 510.

Figure 6A:
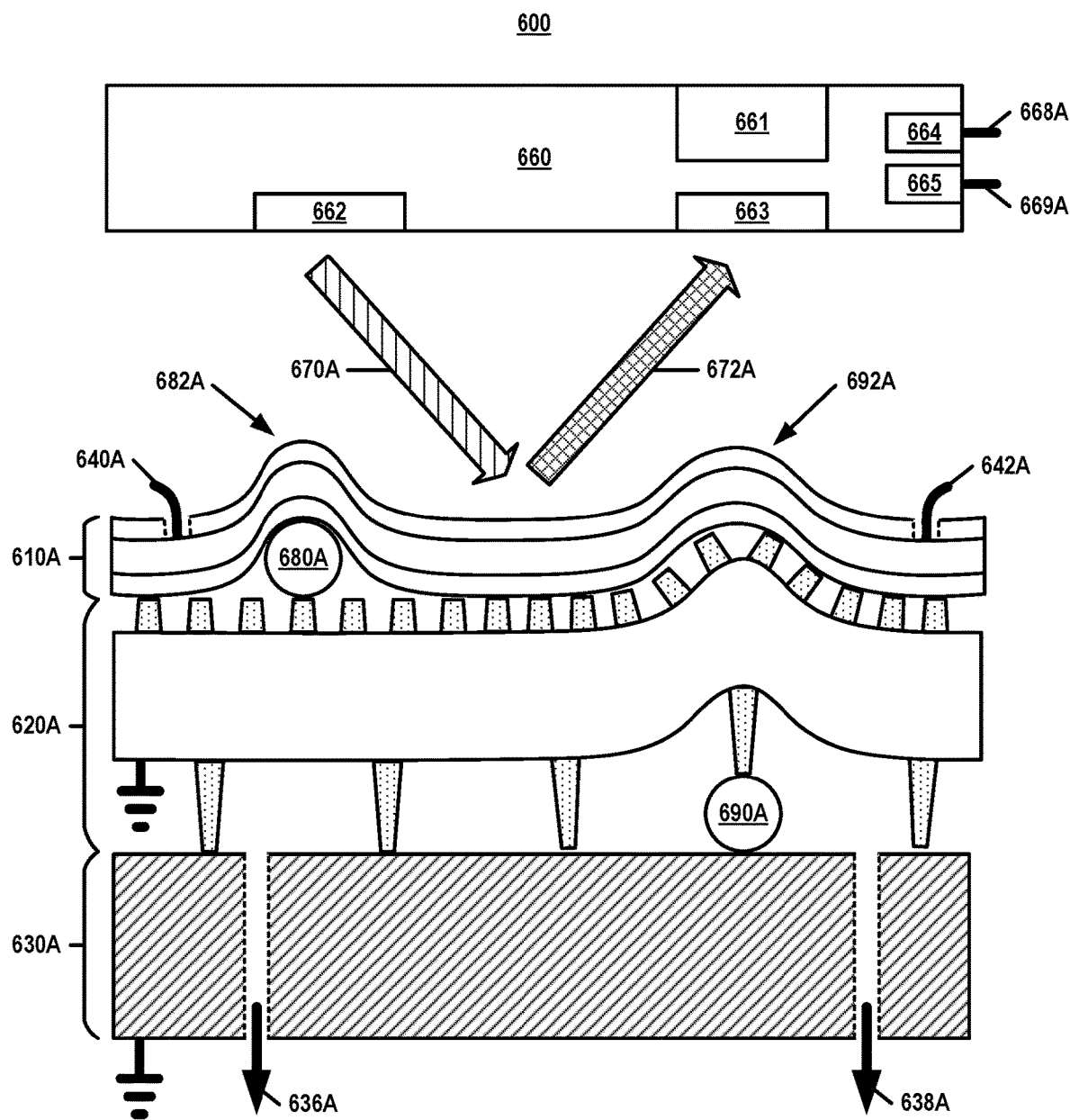
FIGS. 6A, 6B, and 6C are schematic illustrations of cross-sectional views of an example metrology system, substrate, substrate table, and reference block according to some aspects of the present disclosure.
Figure 6B:
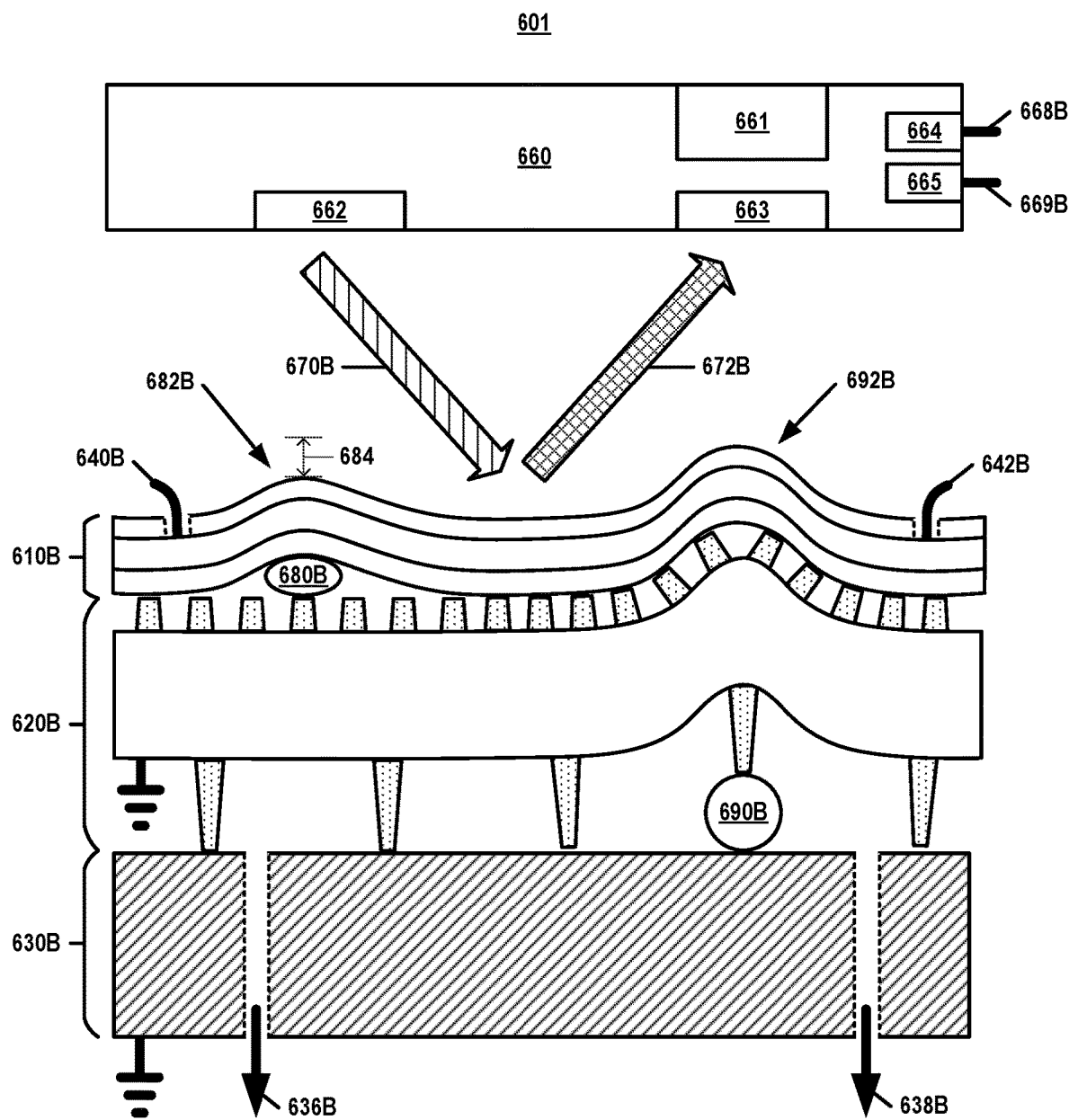
Figure 6C:
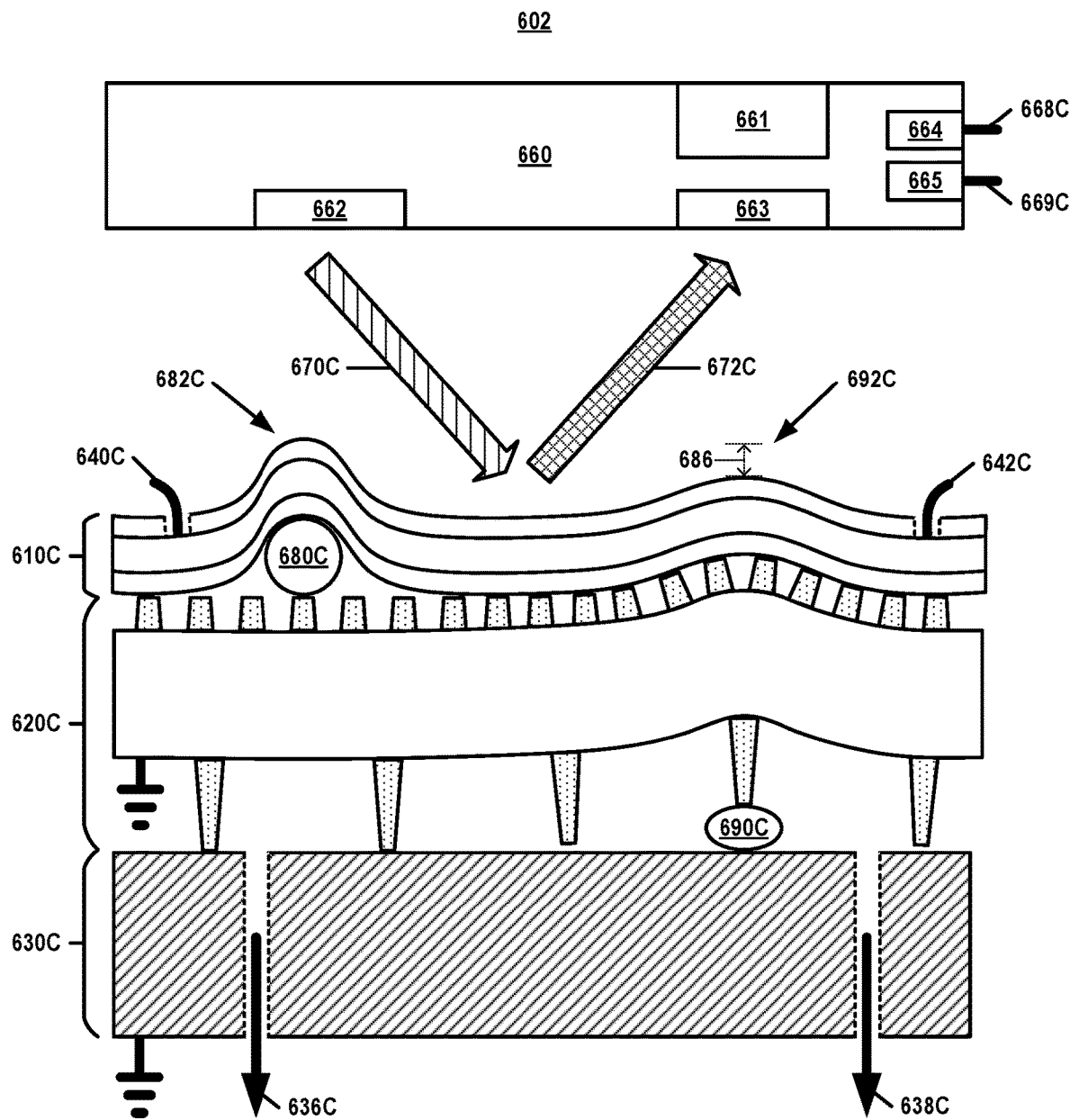

FIGS. 6A, 6B, and 6C are schematic illustrations of cross-sectional views 600, 601, and 602, respectively, of a metrology system 660, substrate 610, substrate table 620, and reference block 630 according to some aspects of the present disclosure. In some aspects, the metrology system 660, substrate 610, substrate table 620, and reference block 630 can include any of the aspects described with reference to the metrology system 560, substrate 510, substrate table 520, and reference block 530, respectively. In FIGS. 6A, 6B, and 6C, the reference letters "A," "B," and "C" following the reference numerals (e.g., 610, 620, etc.) are intended to refer to changes in the physical state (e.g., voltage, vacuum, pressure, shape, flatness, deformation, etc.) of the structure identified by the particular reference numeral.

In some aspects, the metrology system 660 can include a processor 661 configured to apply (e.g., via a voltage controller 664, a voltage control signal 668, and a voltage source coupled to the electrical connection 640) a voltage (e.g., via electrical connection 640) to a substrate 610 to electrostatically clamp the substrate 610 to a substrate table 620. In some aspects, the substrate 610 can include a thermally-grown insulating layer having a thickness of greater than or equal to about 1.0 micron, and the voltage can be between about 0.0 volts and about 50.0 volts. In some aspects, a local electrostatic clamping pressure between the substrate 610 and the substrate table 620 can be less than or equal to about 10.0 bar.

In some aspects, the metrology system 660 (e.g., using the processor 661) can be configured to measure an electrical resistance value between the electrical connection 640 and the electrical connection 642 to ensure that each of the electrical connection 640 and the electrical connection 642 has an acceptable electrical resistance value. In some aspects, the processor 661 can be configured to determine whether the electrical resistance value is greater than or equal to an electrical resistance value threshold. In some aspects, in response to determining that the electrical resistance value is greater than or equal to the electrical resistance value threshold, the metrology system 660 can be configured to generate an electrical connection status signal configured to instruct the processor 661 to generate a display screen overlay, graphic, icon, text, electronic message (e.g., an e-mail or short message service (SMS) message), sound, light (e.g., by actuating a green LED), or any other suitable indication that both the electrical connection 640 and the electrical connection 642 have an acceptable electrical resistance value or are otherwise adequately connected to the substrate 610. In some aspects, in response to determining that the electrical resistance value is less than the electrical resistance value threshold, the processor 661 can be configured to generate an electrical connection alarm signal configured to instruct the system to generate a display screen overlay, graphic, icon, text, electronic message, sound, light (e.g., by actuating a red LED), or any other suitable indication that one or both of the electrical connection 640 and the electrical connection 642 does not have an acceptable resistance value or is otherwise not adequately connected to the substrate 610. In some aspects, the processor 661 can be configured to transmit the electrical connection status signal, the electrical connection alarm signal, or both to one or more user devices, such as one or more of the user input/output device(s) 1003 described with reference to FIG. 10. Additionally or alternatively, in some aspects, the processor 661 can be configured to transmit the electrical connection status signal, the electrical connection alarm signal, or both to one or more electronic storage devices, such as one or more of main memory 1008, secondary memory 1010, and removable storage units 1018 and 1022 described with reference to FIG. 10, for storage in an electronic log, database, or data structure.

In some aspects, the processor 661 can be further configured to apply (e.g., via a vacuum controller 665, a vacuum control signal 669, and a vacuum source coupled to the plurality of vacuum connections of the reference block 630) a vacuum (e.g., vacuum 636, vacuum 638) to a reference block 630 (e.g., via one or more of the plurality of vacuum connections of the reference block 630) to vacuum clamp the substrate table 620 to the reference block 630. In some aspects, the vacuum can be between about 0.0 bar and about 1.0 bar.

In some aspects, the metrology system 660 can further include a radiation source 662 configured to generate radiation 670 in response to application of the voltage to the substrate 610 and the vacuum to the reference block 630. The radiation source 662 can be further configured to transmit the radiation 670 towards the substrate 610. The metrology system 660 can further include a radiation detector 663 configured to receive reflected radiation 672 from the substrate 610 in response to irradiation of the substrate 610 by the radiation 670. The radiation detector 663 can be further configured to measure a flatness of the substrate 610 based on the reflected radiation 672.

In some aspects, the radiation 670 can include a plurality of radiation beams, and the reflected radiation 672 can include a plurality of reflected radiation beams. In some aspects, the processor 661 can be further configured to determine a free form flatness of the substrate table 620 based on the measured flatness of the substrate 610. In some aspects, the radiation detector 663 can be configured to measure the reflected radiation 672 in a near atmospheric environment.

In some aspects, a burl-top particle 680 can be disposed between the substrate 610 and the plurality of top burls of the substrate table 620 (e.g., between one or more burl-top surfaces of the plurality of top burls of the substrate table 620 and one or more portions of the second substrate surface of the substrate 610). In some aspects, the burl-top particle 680 can cause a deformation 682 in the first substrate surface of the substrate 610 (e.g., due to burl-top contamination). In some aspects, a burl-bottom particle 690 can be disposed between the reference block 630 and the plurality of bottom burls of the substrate table 620 (e.g., between one or more burl-bottom surfaces of the plurality of bottom burls of the substrate table 620 and one or more portions of the first reference block surface of the reference block 630). In some aspects, the burl-bottom particle 690 can cause a deformation 692 in the first substrate surface of the substrate 610 (e.g., due to burl-bottom contamination). In some aspects, the burl-top particle 680, the burl-bottom particle 690, or both can have a diameter of less than about one micron under near atmospheric conditions. In some aspects, the metrology system 660 can be configured to separate (e.g., distinguish) burl top contamination from bottom burl contamination based on a change in applied voltage to the substrate 610 while keeping clamping pressure about constant (e.g., as described with reference to FIG. 6B), based on a change in applied vacuum to the reference block 630 while keeping applied voltage about constant (e.g., as described with reference to FIG. 6C), or a combination thereof.

In some aspects, the processor 661 can be further configured to generate contamination data (e.g., burl contamination data) based on the measured first flatness (e.g., as described with reference to FIG. 6A), the measured second flatness (e.g., as described with reference to FIG. 6B), the measured third flatness (e.g., as described with reference to FIG. 6C), or a combination thereof. In some aspects, the generated contamination data can include first contamination data associated with a first set of particles (e.g., including, but not limited to, burl-top particle 680) disposed on a first surface of the substrate table 620. The first contamination data can include, for example, burl-top contamination data associated with a first set of particles disposed between the substrate 610 and the plurality of top burls disposed on the first substrate table surface of the substrate table 620. In some aspects, the processor 661 can be further configured to detect, based on the first contamination data, a first particle (e.g., burl-top particle 680) disposed on the first surface of the substrate table. In some aspects, the detected first particle can have a first diameter of less than about one micron.

In some aspects, the generated contamination data can further include second contamination data associated with a second set of particles (e.g., including, but not limited to, burl-bottom particle 690) disposed on a second surface of the substrate table opposite the first surface of the substrate table 620. The second contamination data can include, for example, burl-bottom contamination data associated with a second set of particles disposed between the reference block 630 and the plurality of bottom burls disposed on the second substrate table surface of the substrate table 620. In some aspects, the processor 661 can be further configured to detect, based on the second contamination data, a second particle (e.g., burl-bottom particle 690) disposed on the second surface of the substrate table. In some aspects, the detected second particle can have a second diameter of less than about one micron.

FIG. 6A illustrates deformation of the substrate 610A due to the burl-top particle 680A and the burl-bottom particle 690A in response to application of a first voltage to the substrate 610A and a first vacuum to the reference block 630A. In some aspects, the first voltage applied to the electrical connection 640A of the substrate 610A can be about 10.0 volts. In some aspects, the first vacuum (e.g., vacuum 636A, vacuum 638A) applied to the vacuum connections of the reference block 630A can be about 0.2 bar.

As shown in FIG. 6A, processor 661 can be configured to apply (e.g., via a voltage controller 664, a voltage control signal 668A, and a voltage source coupled to the electrical connection 640A of the substrate 610A) a first voltage to the substrate 610A (e.g., via electrical connection 640A) to electrostatically clamp the substrate 610A to the substrate table 620A. In some aspects, the metrology system 660 can use the electrical connection 642A as a monitor to make sure that there is a low ohmic connection for the electrical connection 640A such that the first voltage is applied adequately to the substrate 610A.

In some aspects, the burl-top particle 680A can be disposed between the plurality of top burls of the substrate table 620A and the substrate 610A (e.g., between one or more burl-top surfaces of the plurality of top burls and one or more portions of the second substrate surface of the substrate 610A). In some aspects, the burl-top particle 680A can cause a first deformation 682A in the substrate 610A.

In some aspects, the processor 661 can be further configured to apply (e.g., via a vacuum controller 665, a vacuum control signal 669A, and a vacuum source coupled to the plurality of vacuum connections of the reference block 630A) a first vacuum (e.g., vacuum 636A, vacuum 638A) to the reference block 630A (e.g., via one or more of the plurality of vacuum connections of the reference block 630A) to vacuum clamp the substrate table 620A to the reference block 630A. In some aspects, the burl-bottom particle 690A can be disposed between the plurality of bottom burls of the substrate table 620A and the reference block 630A (e.g., between one or more burl-bottom surfaces of the plurality of bottom burls and one or more portions of the reference block 630A). In some aspects, the burl-bottom particle 690A can cause a second deformation 692A in the substrate 610A.

In some aspects, the radiation source 662 can be configured to generate first radiation 670A in response to application of the first voltage to the substrate 610A and the first vacuum to the reference block 630A. The radiation source 662 can be further configured to transmit the first radiation 670A towards the substrate 610A. The radiation detector 663 can be configured to receive first reflected radiation 672A from the substrate 610A in response to irradiation of the substrate 610A by the first radiation 670A. The radiation detector 663 can be further configured to measure a first flatness of the substrate 610A based on the first reflected radiation 672A. The first flatness of the substrate 610A can include the first deformation 682A and the second deformation 692A. The processor 661 can be configured to detect the burl-top particle 680A and the burl-bottom particle 690A based on the first deformation 682A and the second deformation 692A.

FIG. 6B illustrates deformation of the substrate 610B due to the burl-top particle 680B and the burl-bottom particle 690B in response to application of a second voltage to the substrate 610B and a second vacuum to the reference block 630B. In particular, FIG. 6B illustrates compression of the burl-top particle 680B in response to an increase in the voltage applied to the substrate 610B while keeping clamping pressure about constant.

In some aspects, to determine whether detected particles are disposed between the substrate table 620B and the substrate 610B, the metrology system 660 can increase the voltage applied to the substrate 610B while maintaining the vacuum applied to the reference block 630B. As a result, only particles disposed between the substrate table 620B and the substrate 610B will become compressed and the deformations in the substrate 610B caused by those particles will decrease (e.g., become flatter). For example, the burl-top particle 680B will become compressed and the third deformation 682B in the substrate 610B caused by the burl-top particle 680B will decrease by an amount 684 (e.g., relative to the first deformation 682A shown in FIG. 6A). In another example, the burl-bottom particle 690B will not become compressed and the fourth deformation 692B in the substrate 610B caused by the burl-bottom particle 690B will not decrease by a substantial amount (e.g., relative to the second deformation 692A shown in FIG. 6A).

In some aspects, the second voltage can be different from the first voltage. In some aspects, the substrate can include a thermally-grown insulating layer having a thickness of greater than or equal to about 500 nm, and a difference between the second voltage and the first voltage can be less than or equal to about 50 volts (e.g., the difference can be about 30 volts). In some aspects, the second voltage applied to the electrical connection 640B can be greater than the first voltage applied to the electrical connection 640A shown in FIG. 6A, while the second vacuum (e.g., vacuum 636B, vacuum 638B) applied to the vacuum connections of the reference block 630B can be about the same as the first vacuum (e.g., vacuum 636A, vacuum 638A) applied to the vacuum connections of the reference block 630A shown in FIG. 6A. For example, the second voltage applied to the electrical connection 640B can be increased to about 40.0 volts, and the second vacuum (e.g., vacuum 636B, vacuum 638B) applied to the vacuum connections of the reference block 630B can remain at about 0.2 bar.

As shown in FIG. 6B, processor 661 can be configured to apply (e.g., via a voltage controller 664, a voltage control signal 668B, and a voltage source coupled to the electrical connection 640B) a second voltage to the substrate 610B (e.g., via electrical connection 640B) to electrostatically clamp the substrate 610B to the substrate table 620B. In some aspects, the burl-top particle 680B can be disposed between the plurality of top burls of the substrate table 620B and the substrate 610B (e.g., between one or more burl-top surfaces of the plurality of top burls and one or more portions of the second substrate surface of the substrate 610B). In some aspects, the metrology system 660 can use the electrical connection 642B as a monitor to make sure that there is a low ohmic connection for the electrical connection 640B such that the second voltage is applied adequately to the substrate 610B.

In some aspects, the burl-top particle 680B can cause a third deformation 682B in the substrate 610B. In some aspects, where the second voltage is greater than the first voltage, the difference between the third deformation 682B and the first deformation 682A shown in FIG. 6A can be greater than zero as indicated by the amount 684.

In some aspects, the processor 661 can be further configured to apply (e.g., via a vacuum controller 665, a vacuum control signal 669B, and a vacuum source coupled to the plurality of vacuum connections of the reference block 630B) a second vacuum (e.g., vacuum 636B, vacuum 638B) to the reference block 630B (e.g., via one or more of the plurality of vacuum connections of the reference block 630B) to vacuum clamp the substrate table 620B to the reference block 630B. In some aspects, the burl-bottom particle 690B can be disposed between the plurality of bottom burls of the substrate table 620B and the reference block 630B (e.g., between one or more burl-bottom surfaces of the plurality of bottom burls and one or more portions of the reference block 630B). In some aspects, the burl-bottom particle 690B can cause a fourth deformation 692B in the substrate 610B. In some aspects, where the second vacuum is about the same as the first vacuum, the difference between the fourth deformation 692B and the second deformation 692A shown in FIG. 6A can be about zero.

In some aspects, the radiation source 662 can be configured to generate second radiation 670B in response to application of the second voltage to the substrate 610B and the second vacuum to the reference block 630B. The radiation source 662 can be further configured to transmit the second radiation 670B towards the substrate 610B. The radiation detector 663 can be configured to receive second reflected radiation 672B from the substrate 610B in response to irradiation of the substrate 610B by the second radiation 670B. The radiation detector 663 can be further configured to measure a second flatness of the substrate 610B based on the second reflected radiation 672B. The second flatness of the substrate 610B can include the third deformation 682B and the fourth deformation 692B. The processor 661 can be configured to determine that the burl-top particle 680B is a burl-top contaminant and the burl-bottom particle 690B is a burl-bottom contaminant based on the third deformation 682B (e.g., because the difference between the third deformation 682B and the first deformation 682A is greater than a burl-top particle detection value (e.g., 10 nm, 50 nm, 100 nm, or any other suitable value)) and the fourth deformation 692B (e.g., because the difference between the fourth deformation 692B and the second deformation 692A is about zero).

FIG. 6C illustrates deformation of the substrate 610C due to the burl-top particle 680C and the burl-bottom particle 690C in response to application of a third voltage to the substrate 610C and a third vacuum to the reference block 630C. In particular, FIG. 6C illustrates compression of the burl-bottom particle 690C in response to an increase in the vacuum applied to reference block 630C while keeping the voltage applied to the substrate 610C about constant.

In some aspects, to determine whether detected particles are disposed between the substrate table 620C and the reference block 630C, the metrology system 660 can increase the vacuum applied to the reference block 630C while maintaining the voltage applied to the substrate 610C. As a result, only particles disposed between the substrate table 620C and the reference block 630C will become compressed and the deformations in the substrate 610C caused by those particles will decrease (e.g., become flatter). For example, the burl-bottom particle 690C will become compressed and the sixth deformation 692C in the substrate 610C caused by those particles will decrease by an amount 685 (e.g., relative to the second deformation 692A shown in FIG. 6A). In another example, the burl-top particle 680C will not become compressed and the fifth deformation 682C in the substrate 610B caused by the burl-top particle 680C will not decrease by a substantial amount (e.g., relative to the first deformation 682A shown in FIG. 6A).

In some aspects, the third vacuum can be different from the first vacuum. In some aspects, the difference between the third vacuum and the first vacuum can be less than or equal to about 1.0 bar (e.g., the difference can be about 0.6 bar). In some aspects, the third vacuum (e.g., vacuum 636C, vacuum 638C) applied to the vacuum connections of the reference block 630C can be greater than the first vacuum (e.g., vacuum 636A, vacuum 638A) applied to the vacuum connections of the reference block 630A shown in FIG. 6A, while the third voltage applied to the electrical connection 640C can be about the same as the first voltage applied to the electrical connection 640A shown in FIG. 6A. For example, the third vacuum (e.g., vacuum 636C, vacuum 638C) applied to the vacuum connections of the reference block 630C can be increased to about 0.8 bar, and the third voltage applied to the electrical connection 640C can remain at about 10.0 volts.

As shown in FIG. 6C, processor 661 can be configured to apply (e.g., via a voltage controller 664, a voltage control signal 668C, and a voltage source coupled to the electrical connection 640C) a third voltage to the substrate 610C (e.g., via electrical connection 640C) to electrostatically clamp the substrate 610C to the substrate table 620C. In some aspects, the metrology system 660 can use the electrical connection 642C as a monitor to make sure that there is a low ohmic connection for the electrical connection 640C such that the third voltage is applied adequately to the substrate 610C.

In some aspects, the burl-top particle 680C can be disposed between the plurality of top burls of the substrate table 620C and the substrate 610C (e.g., between one or more burl-top surfaces of the plurality of top burls and one or more portions of the third substrate surface of the substrate 610C). In some aspects, the burl-top particle 680C can cause a fifth deformation 682C in the substrate 610C. In some aspects, where the third voltage is about the same as the first voltage, the difference between the fifth deformation 682C and the first deformation 682A shown in FIG. 6A can be about zero.

In some aspects, the processor 661 can be further configured to apply (e.g., via a vacuum controller 665, a vacuum control signal 669C, and a vacuum source coupled to the plurality of vacuum connections of the reference block 630C) a third vacuum (e.g., vacuum 636C, vacuum 638C) to the reference block 630C (e.g., via one or more of the plurality of vacuum connections of the reference block 630C) to vacuum clamp the substrate table 620C to the reference block 630C. In some aspects, the burl-bottom particle 690C can be disposed between the plurality of bottom burls of the substrate table 620C and the reference block 630C (e.g., between one or more burl-bottom surfaces of the plurality of bottom burls and one or more portions of the reference block 630C). In some aspects, the burl-bottom particle 690C can cause a sixth deformation 692C in the substrate 610C. In some aspects, where the third vacuum is greater than the first vacuum, the difference between the sixth deformation 692C and the second deformation 692A shown in FIG. 6A can be greater than zero as indicated by the amount 685.

In some aspects, the radiation source 662 can be configured to generate third radiation 670C in response to application of the third voltage to the substrate 610C and the third vacuum to the reference block 630C. The radiation source 662 can be further configured to transmit the third radiation 670C towards the substrate 610C. The radiation detector 663 can be configured to receive third reflected radiation 672C from the substrate 610C in response to irradiation of the substrate 610C by the third radiation 670C. The radiation detector 663 can be further configured to measure a third flatness of the substrate 610C based on the third reflected radiation 672C. The third flatness of the substrate 610C can include the fifth deformation 682C and the sixth deformation 692C. The processor 661 can be configured to determine that the burl-top particle 680C is a burl-top contaminant and the burl-bottom particle 690C is a burl-bottom contaminant based on the fifth deformation 682C (e.g., because the difference between the fifth deformation 682C and the first deformation 682A is about zero) and the sixth deformation 692C (e.g., because the difference between the sixth deformation 692C and the second deformation 692A is greater than a burl-bottom particle detection value (e.g., 10 nm, 50 nm, 100 nm, or any other suitable value)).

Example Process for Manufacturing an Example Substrate

Figure 7:
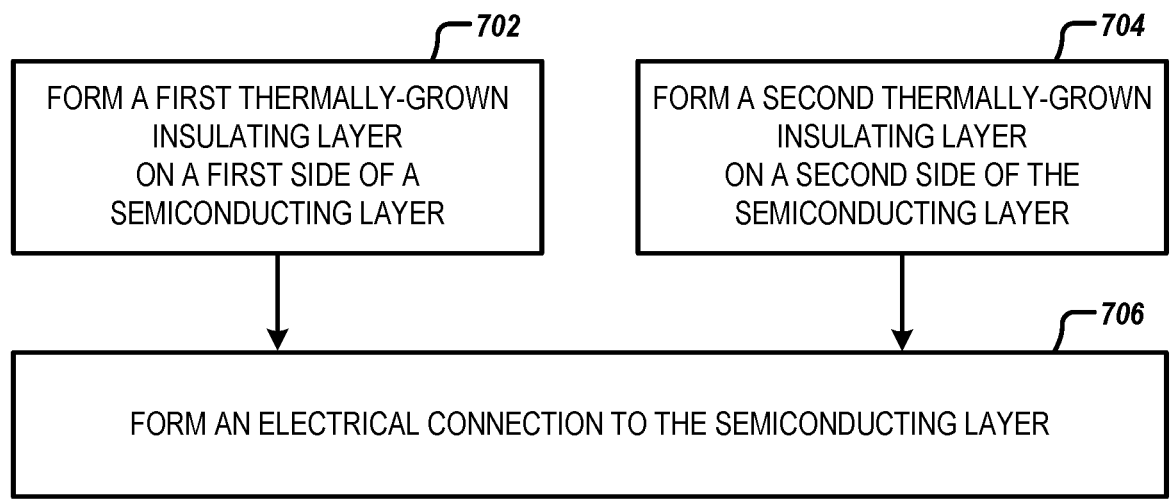
FIG. 7 is an example method for manufacturing an example substrate according to some aspects of the present disclosure or portion(s) thereof.

FIG. 7 is an example method 700 for manufacturing an example substrate (e.g., substrate 510, 610) according to some aspects of the present disclosure or portion(s) thereof. The operations described with reference to example method 700 can be performed by, or according to, any of the systems, apparatuses, components, techniques, or combinations thereof described herein, such as those described with reference to FIGS. 1-6 above and FIGS. 8-10 below.

At operation 702, the method can include forming a first thermally-grown insulating layer (e.g., layer 514) on a first face of a semiconducting layer (e.g., layer 512). The first thermally-grown insulating layer can include a first substrate surface (e.g., first substrate surface 514a). In some aspects, the forming of the first thermally-grown insulating layer can be accomplished using suitable mechanical or other methods and include forming the first thermally-grown insulating layer in accordance with any aspect or combination of aspects described with reference to FIGS. 1-6 above and FIGS. 8-10 below.

At operation 704, the method can include forming a second thermally-grown insulating layer (e.g., third substrate layer 516) on a second face of the semiconducting layer disposed opposite the first face of the semiconducting layer. The second thermally-grown insulating layer can include a second substrate surface (e.g., second substrate surface 516b) disposed opposite the first substrate surface. In some aspects, the forming of the second thermally-grown insulating layer can be accomplished using suitable mechanical or other methods and include forming the second thermally-grown insulating layer in accordance with any aspect or combination of aspects described with reference to FIGS. 1-6 above and FIGS. 8-10 below.

At operation 706, the method can include forming an electrical connection (e.g., electrical connection 540, 640). The electrical connection can be configured to receive a voltage and transmit the voltage to the semiconducting layer to electrostatically clamp the second substrate surface to a substrate table (e.g., substrate table 520, 620) while a flatness of the first substrate surface is measured (e.g., by metrology system 560, 660). In some aspects, the forming of the electrical connection can be accomplished using suitable mechanical or other methods and include forming the electrical connection in accordance with any aspect or combination of aspects described with reference to FIGS. 1-6 above and FIGS. 8-10 below.

Example Process for Manufacturing an Example Substrate Table

Figure 8:
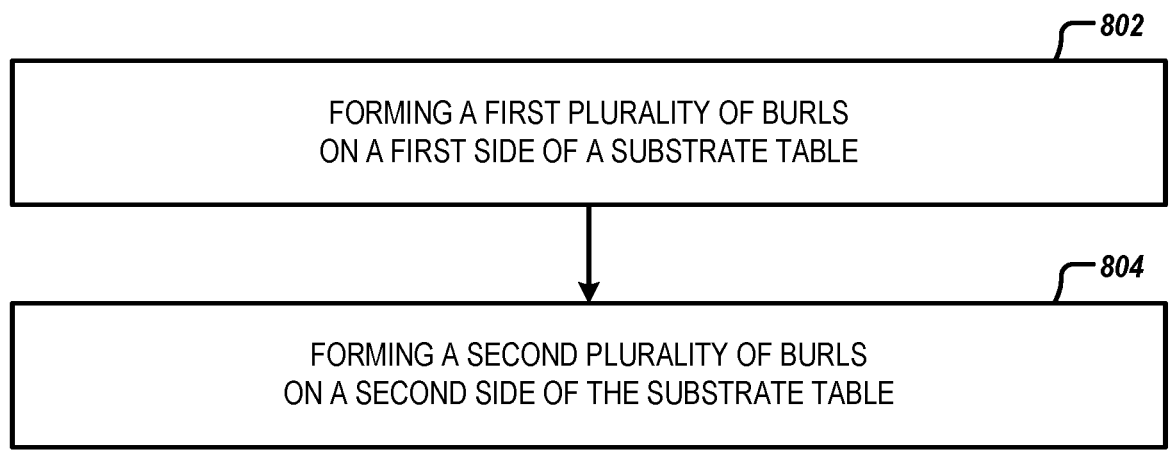
FIG. 8 is an example method for manufacturing an example substrate table according to some aspects of the present disclosure or portion(s) thereof.

FIG. 8 is an example method 800 for manufacturing an example substrate table (e.g., substrate table 520, 620) according to some aspects of the present disclosure or portion(s) thereof. The operations described with reference to example method 800 can be performed by, or according to, any of the systems, apparatuses, components, techniques, or combinations thereof described herein, such as those described with reference to FIGS. 1-7 above and FIGS. 9-10 below.

At operation 802, the method can include forming a first plurality of burls (e.g., plurality of top burls 524) on a first surface (e.g., first substrate table surface 522a) of a substrate table (e.g., substrate table 520, 620). The first plurality of burls can be configured to support a substrate (e.g., substrate 510, 6210) comprising a semiconducting layer (e.g., layer 512), a first thermally-grown insulating layer (e.g., layer 514) disposed on a first face of the semiconducting layer, and a second thermally-grown insulating layer (e.g., third substrate layer 516) disposed on a second face of the semiconducting layer opposite the first face of the semiconducting layer. Each of the first plurality of burls can include a burl-top surface (e.g., burl-top surface 524a) configured to contact a portion of the substrate in response to an application of a voltage to the semiconducting layer of the substrate (e.g., via electrical connection 540, 640) while a flatness of the substrate is measured (e.g., by metrology system 560, 660). In some aspects, the forming of the first plurality of burls can be accomplished using suitable mechanical or other methods and include forming the first plurality of burls in accordance with any aspect or combination of aspects described with reference to FIGS. 1-7 above and FIGS. 9-10 below.

At operation 804, the method can include forming a second plurality of burls (e.g., plurality of bottom burls 526) on a second surface (e.g., second substrate table surface 522b) of the substrate table disposed opposite the first surface of the substrate table. The second plurality of burls can be configured to be supported by a reference block (e.g., reference block 530) comprising a vacuum connection (e.g., plurality of vacuum connections 534). Each of the second plurality of burls can include a burl-bottom surface (e.g., burl-bottom surface 526b) configured to contact a portion of the reference block in response to an application of a vacuum to the vacuum connection of the reference block while the flatness of the substrate is measured. In some aspects, the forming of the second plurality of burls can be accomplished using suitable mechanical or other methods and include forming the second plurality of burls in accordance with any aspect or combination of aspects described with reference to FIGS. 1-7 above and FIGS. 9-10 below.

Example Process for Measuring a Flatness of an Example Substrate

Figure 9:
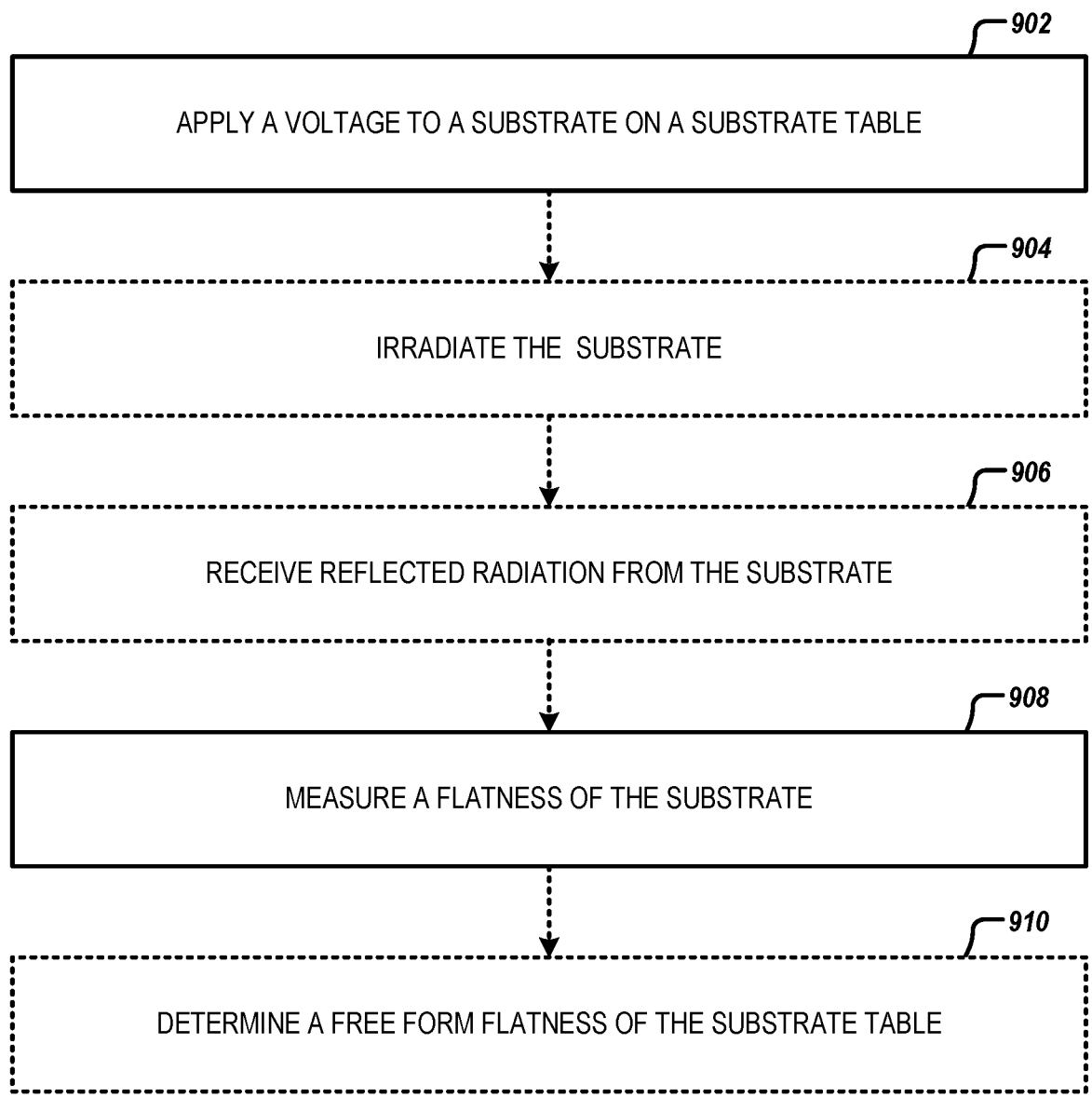
FIG. 9 is an example method for measuring a flatness of an example substrate according to some aspects of the present disclosure or portion(s) thereof.

FIG. 9 is an example method 900 for measuring a flatness of an example substrate according to some aspects of the present disclosure or portion(s) thereof. The operations described with reference to example method 900 can be performed by, or according to, any of the systems, apparatuses, components, techniques, or combinations thereof described herein, such as those described with reference to FIGS. 1-8 above and FIG. 10 below.

At operation 902, the method can include applying, by a voltage source (e.g., in response to a voltage control signal 568 generated by voltage controller 564, 664; processor 561, 661; or a combination thereof), a voltage (e.g., via electrical connection 540, 640) to a substrate (e.g., substrate 510, 610) to electrostatically clamp the substrate to a substrate table (e.g., substrate table 520, 620). In some aspects, before operation 904, the method can further include applying, by a vacuum source (e.g., in response to a vacuum control signal 569 generated by vacuum controller 565, 665; processor 561, 661; or a combination thereof), a vacuum (e.g., vacuum 536, 538, 636, 638) to a reference block (e.g., reference block 530, 630 via plurality of vacuum connections 534) to vacuum clamp the substrate table to the reference block. In some aspects, the applying of the voltage can be accomplished using suitable mechanical or other methods and include applying the voltage in accordance with any aspect or combination of aspects described with reference to FIGS. 1-8 above and FIG. 10 below.

At operation 904, the method can include irradiating, by a radiation source (e.g., radiation source 562, 662), the electrostatically-clamped substrate with radiation (e.g., radiation 570, 670) in response to the applying of the voltage (and, in some aspects, further in response to the applying of the vacuum). In some aspects, the irradiating of the electrostatically-clamped substrate can be accomplished using suitable mechanical or other methods and include irradiating the electrostatically-clamped substrate in accordance with any aspect or combination of aspects described with reference to FIGS. 1-8 above and FIG. 10 below.

At operation 906, the method can include receiving, by a radiation detector (e.g., radiation detector 563, 663), reflected radiation (e.g., reflected radiation 572, 672) from the electrostatically-clamped substrate in response to the irradiating of the substrate. In some aspects, the receiving of the reflected radiation can be accomplished using suitable mechanical or other methods and include receiving the reflected radiation in accordance with any aspect or combination of aspects described with reference to FIGS. 1-8 above and FIG. 10 below.

At operation 908, the method can include measuring, by the radiation detector, a flatness of the substrate based on the reflected radiation. In some aspects, the measuring of the flatness of the substrate can be accomplished using suitable mechanical or other methods and include measuring the flatness of the substrate in accordance with any aspect or combination of aspects described with reference to FIGS. 1-8 above and FIG. 10 below.

At operation 910, the method can include determining, by the metrology system, a free form flatness of the substrate table based on the measured flatness of the substrate. In some aspects, the determining of the free form flatness of the substrate table can be accomplished using suitable mechanical or other methods and include determining the free form flatness of the substrate table in accordance with any aspect or combination of aspects described with reference to FIGS. 1-8 above and FIG. 10 below.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 10:
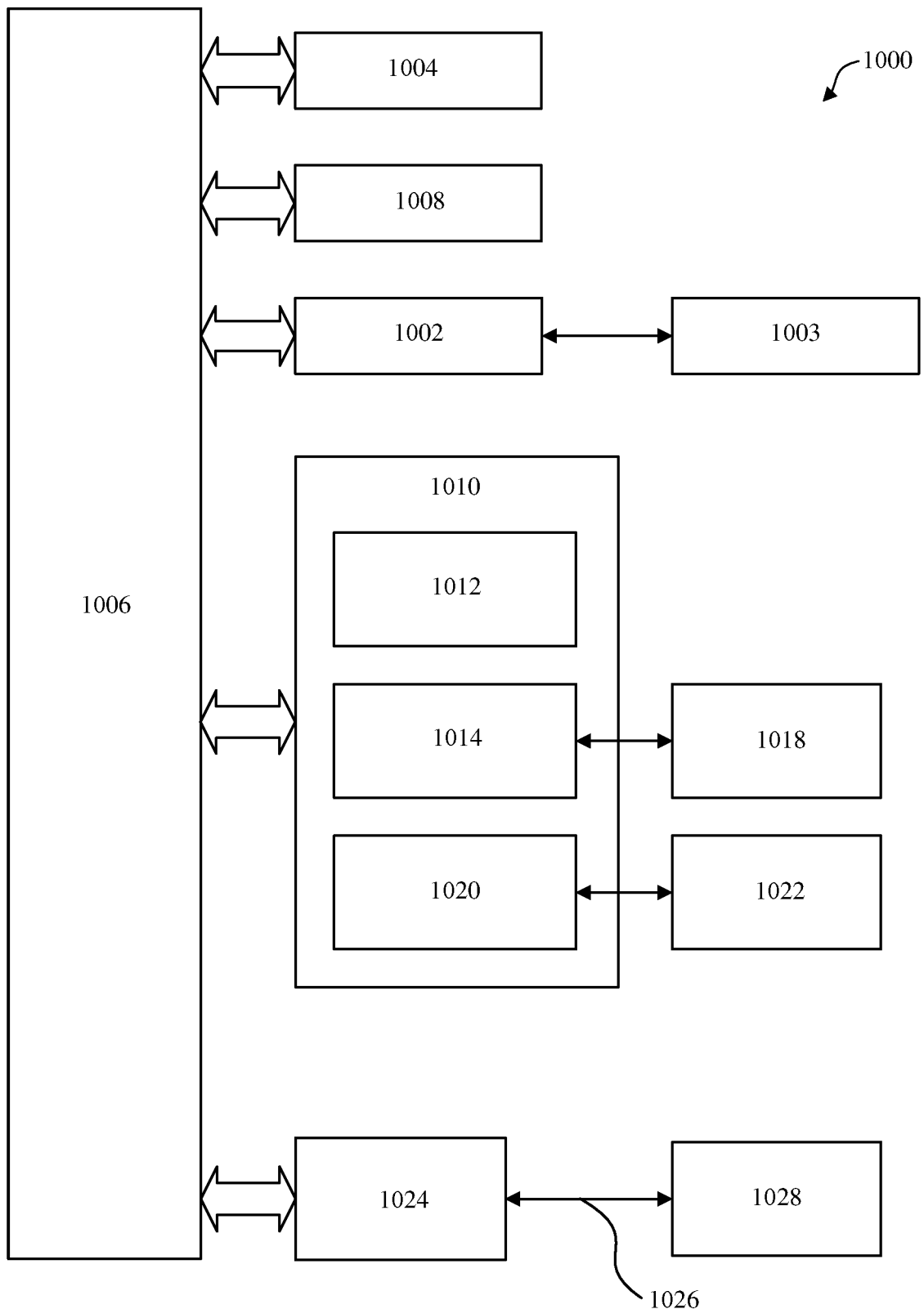
FIG. 10 is an example computer system for implementing some aspects of the present disclosure or portion(s) thereof.

Various aspects can be implemented, for example, using one or more computing systems, such as example computing system 1000 shown in FIG. 10. Example computing system 1000 can be a specialized computer capable of performing the functions described herein such as: the metrology system 560 described with reference to FIG. 5B; the metrology system 660 described with reference to FIGS. 6A, 6B, and 6C; any other suitable system, sub-system, or component; or any combination thereof. Example computing system 1000 can include one or more processors (also called central processing units, or CPUs), such as a processor 1004. Processor 1004 is connected to a communication infrastructure 1006 (e.g., a bus). Example computing system 1000 can also include user input/output device(s) 1003, such as monitors, displays, lights (e.g., LEDs), keyboards, pointing devices, speakers, microphones, etc., that communicate with communication infrastructure 1006 through user input/output interface(s) 1002. Example computing system 1000 can also include a main memory 1008 (e.g., one or more primary storage devices), such as random access memory (RAM). Main memory 1008 can include one or more levels of cache.

Main memory 1008 has stored therein control logic (e.g., computer software) and/or data.

Example computing system 1000 can also include a secondary memory 1010 (e.g., one or more secondary storage devices). Secondary memory 1010 can include, for example, a hard disk drive 1012 and/or a removable storage drive 1014. Removable storage drive 1014 can be a floppy disk drive, a magnetic tape drive, a compact disk drive, an optical storage device, tape backup device, and/or any other storage device/drive.

Removable storage drive 1014 can interact with a removable storage unit 1018. Removable storage unit 1018 includes a computer usable or readable storage device having stored thereon computer software (control logic) and/or data. Removable storage unit 1018 can be a floppy disk, magnetic tape, compact disk, DVD, optical storage disk, and/or any other computer data storage device. Removable storage drive 1014 reads from and/or writes to removable storage unit 1018.

According to some aspects, secondary memory 1010 can include other means, instrumentalities or other approaches for allowing computer programs and/or other instructions and/or data to be accessed by example computing system 1000. Such means, instrumentalities or other approaches can include, for example, a removable storage unit 1022 and an interface 1020. Examples of the removable storage unit 1022 and the interface 1020 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1000 can further include a communications interface 1024 (e.g., one or more network interfaces). Communications interface 1024 enables example computing system 1000 to communicate and interact with any combination of remote devices, remote networks, remote entities, etc. (individually and collectively referred to as remote devices 1028). For example, communications interface 1024 can allow example computing system 1000 to communicate with remote devices 1028 over communications path 1026, which can be wired and/or wireless, and which can include any combination of LANs, WANs, the Internet, etc. Control logic, data, or both can be transmitted to and from example computing system 1000 via communications path 1026.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1000, main memory 1008, secondary memory 1010 and removable storage units 1018 and 1022, as well as tangible articles of manufacture embodying any combination of the foregoing. Such control logic, when executed by one or more data processing devices (such as example computing system 1000), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 10. In particular, aspects of the disclosure can operate with software, hardware, and/or operating system implementations other than those described herein.

The embodiments may further be described using the following clauses:

1. A substrate comprising:
    a first substrate layer comprising a semiconducting material;
    a second substrate layer comprising an insulating material;
    a substrate surface disposed on the second substrate layer; and
    an electrical connection configured to:
        receive a voltage; and
        transmit the voltage to the first substrate layer to electrostatically clamp the substrate to a substrate table while a flatness of the substrate surface is measured.
2. The substrate of clause 1, wherein a free form flatness of the substrate table is measured based on the measured flatness of the substrate surface.
3. The substrate of clause 1, wherein the flatness of the substrate surface is measured in a near atmospheric environment.
4. The substrate of clause 1, wherein:
    the second substrate layer has a thickness of greater than or equal to about 500 nanometers; and
    the voltage is greater than or equal to about 50 volts.
5. The substrate of clause 1, wherein the substrate comprises an electrostatic wafer comprising the first substrate layer, the second substrate layer, the substrate surface, and the electrical connection.
6. The substrate of clause 1, wherein the insulating material is a thermally-grown insulating material.
7. The substrate of clause 6, wherein the thermally-grown insulating material is a thermally-grown oxide material.
8. The substrate of clause 7, wherein the thermally-grown oxide material is a thermally-grown silicon dioxide material.
9. The substrate of clause 1, wherein the second substrate layer is formed to a thickness of between about 0.5 micrometers (microns) and about 5.0 microns.
10. The substrate of clause 1, wherein:
    the substrate surface is a first substrate surface;
    the substrate further comprises:
        a third substrate layer comprising the insulating material; and
        a second substrate surface disposed on the third substrate layer opposite the first substrate surface; and
    the electrical connection is further configured to:
        transmit the voltage to the first substrate layer to electrostatically clamp the second substrate surface to the substrate table.
11. The substrate of clause 1, wherein:
    the electrical connection is a first electrical connection;
    the substrate further comprises a second electrical connection;
    the substrate is configured to generate a resistance value between the first electrical connection and the second electrical connection.
12. A system, comprising:
    a substrate comprising:
        a first substrate layer comprising a semiconducting material;

a second substrate layer comprising a thermally-grown insulating material and formed on a first face of the first substrate layer;
a third substrate layer comprising the thermally-grown insulating material and formed on a second face of the first substrate layer opposite the first face of the first substrate layer;
a first substrate surface disposed on the second substrate layer;
a second substrate surface disposed on the third substrate layer opposite the first substrate surface; and
an electrical connection configured to:
receive a voltage; and
transmit the voltage to the first substrate layer to electrostatically clamp the second substrate surface to a substrate table while a flatness of the first substrate surface is measured.

13. The system of clause 12, wherein a free form flatness of the substrate table is measured based on the measured flatness of the first substrate surface.

14. The system of clause 12, wherein the flatness of the first substrate surface is measured in a near atmospheric environment.

15. The system of clause 12, wherein:
the second substrate layer has a thickness of greater than or equal to about 500 nanometers; and
the voltage is greater than or equal to about 50 volts.

16. The system of clause 12, wherein the substrate comprises an electrostatic wafer comprising the first substrate layer, the second substrate layer, the third substrate layer, the first substrate surface, the second substrate surface, and the electrical connection.

17. The system of clause 12, wherein the thermally-grown insulating material is a thermally-grown silicon dioxide material.

18. The system of clause 12, wherein the second substrate layer is formed to a thickness of between about 0.5 micrometers (microns) and about 5.0 microns.

19. The system of clause 12, wherein:
the electrical connection is a first electrical connection;
the substrate further comprises a second electrical connection;
the system further comprises a metrology system configured to:
measure a resistance value between the first electrical connection and the second electrical connection.

20. A method for manufacturing a substrate, comprising:
forming a first thermally-grown insulating layer on a first face of a semiconducting layer, wherein the first thermally-grown insulating layer comprises a first substrate surface;
forming a second thermally-grown insulating layer on a second face of the semiconducting layer disposed opposite the first face of the semiconducting layer, wherein the second thermally-grown insulating layer comprises a second substrate surface disposed opposite the first substrate surface; and
forming an electrical connection configured to:
receive a voltage; and
transmit the voltage to the semiconducting layer to electrostatically clamp the second substrate surface to a substrate table while a flatness of the first substrate surface is measured.

21. A substrate table, comprising:
a substrate table surface configured to support a substrate comprising a semiconducting layer and an insulating layer; and
an electrical connection configured to ground the substrate table;
wherein the substrate table is configured to:
in response to an application of a voltage to the semiconducting layer of the substrate, electrostatically clamp the substrate to the substrate table surface while a flatness of the substrate is measured.

22. The substrate table of clause 21, wherein a free form flatness of the substrate table surface is measured based on the measured flatness of the substrate.

23. The substrate table of clause 21, wherein the flatness of the substrate is measured in a near atmospheric environment.

24. The substrate table of clause 21, wherein:
the insulating layer has a thickness of greater than or equal to about 500 nanometers; and
the voltage is greater than or equal to about 50 volts.

25. The substrate table of clause 21, wherein the insulating layer is a thermally-grown insulating layer.

26. The substrate table of clause 25, wherein the thermally-grown insulating layer is formed to a thickness of between about 0.5 micrometers (microns) and about 5.0 microns.

27. The substrate table of clause 21, wherein the substrate table comprises siliconized silicon carbide (SiSiC).

28. The substrate table of clause 21, wherein:
the substrate table further comprises a plurality of burls disposed on the substrate table surface; and
each of the plurality of burls comprises a burl-top surface configured to contact a portion of the substrate in response to the application of the voltage to the semiconducting layer of the substrate.

29. The substrate table of clause 28, wherein the plurality of burls comprises at least one material selected from the group consisting of diamond-like carbon (DLC), aluminum nitride (AlN), silicon nitride (SiN), or chromium nitride (CrN).

30. The substrate table of clause 28, wherein, for each of the plurality of burls, a local electrostatic clamping pressure between the burl-top surface and the portion of the substrate is less than or equal to about ten bar.

31. The substrate table of clause 28, wherein:
the substrate table surface is a first substrate table surface;
the substrate table further comprises a second substrate table surface disposed opposite the first substrate table surface; and
the substrate table is further configured to:
in response to an application of a vacuum to a vacuum connection of a reference block, vacuum clamp the second substrate table surface to the reference block while the flatness of the substrate is measured.

32. The substrate table of clause 31, wherein the substrate table is further configured to:
in response to the application of the vacuum to the vacuum connection of the reference block, vacuum clamp the second substrate table surface to a three-point support structure of the reference block while a gravity sag of the substrate table is measured.

33. The substrate table of clause 32, wherein a free form flatness of the substrate table surface is measured based on the measured flatness of the substrate and the measured gravity sag of the substrate table.

34. The substrate table of clause 31, wherein:
the plurality of burls is a first plurality of burls;
the substrate table further comprises a second plurality of burls disposed on the second substrate table surface; and
each of the second plurality of burls comprises a burl-bottom surface configured to contact a portion of the reference block in response to the application of the vacuum to the vacuum connection of the reference block.

35. The substrate table of clause 34, wherein:
the application of the voltage is a first application of a first voltage;
the measured flatness of the substrate is a measured first flatness of the substrate;
the substrate table is further configured to:
in response to a second application of a second voltage to the semiconducting layer of the substrate, electrostatically clamp the substrate to the substrate table surface while a second flatness of the substrate is measured.

36. The substrate table of clause 35, wherein:
the substrate comprises a thermally-grown insulating layer having a thickness of greater than or equal to about 500 nanometers; and
a difference between the first voltage and the second voltage is less than or equal to about 10 volts.

37. The substrate table of clause 35, wherein burl contamination is measured based on the measured first flatness of the substrate and the measured second flatness of the substrate.

38. The substrate table of clause 37, wherein:
the measured burl contamination comprises:
burl-top contamination data associated with a first set of particles disposed between the first plurality of burls and the substrate; and
burl-bottom contamination data associated with a second set of particles disposed between the second plurality of burls and the reference block;
the first set of particles comprises a detected first particle having a first diameter of less than about one micron; and
the second set of particles comprises a detected second particle having a second diameter of less than about one micron.

39. A system, comprising:
a substrate table comprising:
a first substrate table surface;
a second substrate table surface disposed opposite the first substrate table surface;
a first plurality of burls disposed on the first substrate table surface and configured to support a substrate comprising a semiconducting layer, a first thermally-grown insulating layer disposed on a first face of the semiconducting layer, and a second thermally-grown insulating layer disposed on a second face of the semiconducting layer opposite the first face of the semiconducting layer;
a second plurality of burls disposed on the second substrate table surface and configured to be supported by a reference block comprising a vacuum connection; and
an electrical connection configured to ground the substrate table;
wherein the substrate table is configured to:
in response to an application of a voltage to the semiconducting layer of the substrate, electrostatically clamp the substrate to the first plurality of burls while a flatness of the substrate is measured; and
in response to an application of a vacuum to the vacuum connection of the reference block, vacuum clamp the reference block to the second plurality of burls while the flatness of the substrate is measured.

40. A method for manufacturing a substrate table, comprising:
forming a first plurality of burls on a first surface of the substrate table; and
forming a second plurality of burls on a second surface of the substrate table disposed opposite the first surface of the substrate table;
wherein:
the first plurality of burls is configured to support a substrate comprising a semiconducting layer, a first thermally-grown insulating layer disposed on a first face of the semiconducting layer, and a second thermally-grown insulating layer disposed on a second face of the semiconducting layer opposite the first face of the semiconducting layer;
the second plurality of burls is configured to be supported by a reference block comprising a vacuum connection;
each of the first plurality of burls comprises a burl-top surface configured to contact a portion of the substrate in response to an application of a voltage to the semiconducting layer of the substrate while a flatness of the substrate is measured; and
each of the second plurality of burls comprises a burl-bottom surface configured to contact a portion of the reference block in response to an application of a vacuum to the vacuum connection of the reference block while the flatness of the substrate is measured.

41. A metrology system, comprising:
a processor configured to:
apply a voltage to a substrate to electrostatically clamp the substrate to a substrate table;
a radiation source configured to:
in response to application of the voltage to the substrate, generate radiation; and
transmit the generated radiation towards the electrostatically-clamped substrate; and
a radiation detector configured to:
in response to irradiation of the substrate by the transmitted radiation, receive reflected radiation from the electrostatically-clamped substrate; and
measure a flatness of the substrate based on the received reflected radiation.

42. The metrology system of clause 41, wherein:
the generated radiation comprises a plurality of radiation beams; and
the reflected radiation comprises a plurality of reflected radiation beams.

43. The metrology system of clause 41, wherein the processor is further configured to determine a free form flatness of the substrate table based on the measured flatness of the substrate.

44. The metrology system of clause 41, wherein the radiation detector is configured to measure the received reflected radiation in a near atmospheric environment.

45. The metrology system of clause 41, wherein:
   the substrate comprises a thermally-grown insulating layer having a thickness of greater than or equal to about 500 nanometers; and
   the voltage is greater than or equal to about 50 volts.
46. The metrology system of clause 41, wherein the substrate comprises:
   a semiconducting layer;
   a first thermally-grown insulating layer disposed on a first face of the semiconducting layer;
   a second thermally-grown insulating layer disposed on a second face of the semiconducting layer opposite the first face of the semiconducting layer; and
   an electrical connection configured to:
     receive the applied voltage; and
     transmit the received voltage to the semiconducting layer to electrostatically clamp the second thermally-grown insulating layer of the substrate to the substrate table while the flatness of the first thermally-grown insulating layer of the substrate is measured.
47. The metrology system of clause 41, wherein the substrate table comprises a wafer table for deep ultraviolet (DUV) lithography.
48. The metrology system of clause 41, wherein the substrate table comprises a wafer clamp for extreme ultraviolet (EUV) lithography.
49. The metrology system of clause 41, wherein the substrate comprises an electrostatic wafer.
50. The metrology system of clause 41, wherein a local electrostatic clamping pressure between the substrate and the substrate table is less than or equal to about ten bar.
51. The metrology system of clause 41, wherein the processor is further configured to apply a vacuum to a reference block to vacuum clamp the substrate table to the reference block.
52. The metrology system of clause 51, wherein:
   the reference block comprises a three-point support structure; and
   the processor is further configured to:
     apply the vacuum to the reference block to vacuum clamp the substrate table to the three-point support structure of the reference block;
     determine a gravity sag of the substrate table based on the received reflected radiation; and
     determine a modified flatness of the substrate based on the measured flatness of the substrate and the determined gravity sag of the substrate table.
53. The metrology system of clause 52, wherein the processor is further configured to determine a free form flatness of the substrate table based on the modified flatness of the substrate.
54. The metrology system of clause 41, wherein:
   the voltage is a first voltage;
   the radiation is first radiation;
   the reflected radiation is first reflected radiation;
   the flatness is a first flatness;
   the processor is further configured to:
     apply, at a first time, the first voltage to the substrate;
     apply, at a second time different from the first time, a second voltage to the substrate, wherein the second voltage is different from the first voltage;
   the radiation source is further configured to:
     in response to application of the second voltage to the substrate, generate second radiation; and
     transmit the generated second radiation towards the electrostatically-clamped substrate; and
   the radiation detector is further configured to:
     in response to irradiation of the substrate by the transmitted second radiation, receive second reflected radiation from the electrostatically-clamped substrate; and
     measure a second flatness of the substrate based on the received second reflected radiation.
55. The metrology system of clause 54, wherein:
   the substrate comprises a thermally-grown insulating layer having a thickness of greater than or equal to about 500 nanometers; and
   a difference between the first voltage and the second voltage is less than or equal to about 10 volts.
56. The metrology system of clause 54, wherein the processor is further configured to generate contamination data based on the measured first flatness and the measured second flatness.
57. The metrology system of clause 56, wherein the generated contamination data comprises:
   first contamination data associated with a first set of particles disposed on a first surface of the substrate table; and
   second contamination data associated with a second set of particles disposed on a second surface of the substrate table opposite the first surface of the substrate table.
58. The metrology system of clause 57, wherein the processor is further configured to:
   detect, based on the first contamination data, a first particle disposed on the first surface of the substrate table; and
   detect, based on the second contamination data, a second particle disposed on the second surface of the substrate table;
   wherein:
     the detected first particle has a first diameter of less than about one micron; and
     the detected second particle has a second diameter of less than about one micron.
59. A method for determining a flatness of a substrate, comprising:
   applying, by a voltage source, a voltage to a substrate to electrostatically clamp the substrate to a substrate table;
   irradiating, by a radiation source, the electrostatically-clamped substrate with radiation in response to the applying of the voltage;
   receiving, by a radiation detector, reflected radiation from the electrostatically-clamped substrate in response to the irradiating of the substrate; and
   measuring, by the radiation detector, a flatness of the substrate based on the reflected radiation.
60. A method for determining a free form flatness of a substrate table, comprising:
   applying, by a processor, a voltage to a substrate to electrostatically clamp the substrate to a substrate table;
   measuring, by the processor, a flatness of the substrate;
   determining, by the processor, a free form flatness of the substrate table based on the measured flatness of the substrate.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A substrate comprising:
   an electrostatic wafer comprising a first substrate layer, a second substrate layer, a substrate surface, and an electrical connection, wherein:
   the first substrate layer comprises a semiconducting material;
   the second substrate layer comprises an insulating material;
   the substrate surface is disposed on the second substrate layer; and
   the electrical connection is configured to:
     receive a voltage; and
     transmit the voltage to the first substrate layer to electrostatically clamp the substrate to a substrate table while a flatness of the substrate surface is measured.

2. The substrate of claim 1, wherein a free form flatness of the substrate table is measured based on the measured flatness of the substrate surface.

3. The substrate of claim 1, wherein the flatness of the substrate surface is measured in a near atmospheric environment.

4. The substrate of claim 1, wherein:
   the second substrate layer has a thickness of greater than or equal to about 500 nanometers; and
   the voltage is greater than or equal to about 50 volts.

5. The substrate of claim 1, wherein the insulating material is a thermally-grown insulating material.

6. The substrate of claim 5, wherein the thermally-grown insulating material is a thermally-grown oxide material.

7. The substrate of claim 6, wherein the thermally-grown oxide material is a thermally-grown silicon dioxide material.

8. The substrate of claim 1, wherein the second substrate layer is formed to a thickness of between about 0.5 micrometers (microns) and about 5.0 microns.

9. The substrate of claim 1, wherein:
   the substrate surface is a first substrate surface;
   the substrate further comprises:
     a third substrate layer comprising the insulating material; and
     a second substrate surface disposed on the third substrate layer opposite the first substrate surface; and
   the electrical connection is further configured to:
     transmit the voltage to the first substrate layer to electrostatically clamp the second substrate surface to the substrate table.

10. The substrate of claim 1, wherein:
    the electrical connection is a first electrical connection;
    the substrate further comprises a second electrical connection; and
    the substrate is configured to generate a resistance value between the first electrical connection and the second electrical connection.

11. A system, comprising:
    a substrate comprising an electrostatic wafer comprising a first substrate layer, a second substrate layer, a third substrate layer, a first substrate surface, a second substrate surface, and an electrical connection, wherein:
    the first substrate layer comprises a semiconducting material;
    the second substrate layer comprises a thermally-grown insulating material that is formed on a first face of the first substrate layer;

the third substrate layer comprises the thermally-grown insulating material that is formed on a second face of the first substrate layer opposite the first face of the first substrate layer;

the first substrate surface is disposed on the second substrate layer;

the second substrate surface is disposed on the third substrate layer opposite the first substrate surface; and the electrical connection is configured to:
  receive a voltage; and
  transmit the voltage to the first substrate layer to electrostatically clamp the second substrate surface to a substrate table while a flatness of the first substrate surface is measured.

12. The system of claim 11, wherein a free form flatness of the substrate table is measured based on the measured flatness of the first substrate surface.

13. The system of claim 11, wherein the flatness of the first substrate surface is measured in a near atmospheric environment.

14. The system of claim 11, wherein:
  the second substrate layer has a thickness of greater than or equal to about 500 nanometers; and
  the voltage is greater than or equal to about 50 volts.

15. The system of claim 11, wherein the thermally-grown insulating material is a thermally-grown silicon dioxide material.

16. The system of claim 11, wherein the second substrate layer is formed to a thickness of between about 0.5 micrometers (microns) and about 5.0 microns.

17. The system of claim 11, wherein:
the electrical connection is a first electrical connection;
the substrate further comprises a second electrical connection; and
the system further comprises a metrology system configured to:
  measure a resistance value between the first electrical connection and the second electrical connection.

18. A method for manufacturing a substrate, comprising:
forming an electrostatic wafer comprising a first thermally-grown insulating layer, a second thermally-grown insulating layer, a semiconducting layer, a first substrate surface, a second substrate surface, and an electrical connection;

forming the first thermally-grown insulating layer on a first face of the semiconducting layer, wherein the first thermally-grown insulating layer comprises a first substrate surface;

forming the second thermally-grown insulating layer on a second face of the semiconducting layer disposed opposite the first face of the semiconducting layer, wherein the second thermally-grown insulating layer comprises a second substrate surface disposed opposite the first substrate surface; and forming the electrical connection that:
  receives a voltage; and
  transmits the voltage to the semiconducting layer to electrostatically clamp the second substrate surface to a substrate table while a flatness of the first substrate surface is measured.

* * * * *